United States Patent
Chang et al.

(10) Patent No.: US 11,569,248 B2
(45) Date of Patent: Jan. 31, 2023

(54) INTEGRATED CIRCUIT INCLUDING EFUSE CELL

(71) Applicant: TAIWAN SEMICONDUCTOR MANUFACTURING CO., LTD., Hsinchu (TW)

(72) Inventors: Meng-Sheng Chang, Hsinchu County (TW); Yao-Jen Yang, Hsinchu County (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 259 days.

(21) Appl. No.: 16/990,995

(22) Filed: Aug. 11, 2020

(65) Prior Publication Data

US 2022/0052058 A1 Feb. 17, 2022

(51) Int. Cl.
  *H01L 27/112* (2006.01)
  *G11C 17/16* (2006.01)

(52) U.S. Cl.
  CPC ...... *H01L 27/11206* (2013.01); *G11C 17/165* (2013.01)

(58) Field of Classification Search
  CPC ........... H01L 23/5256; H01L 27/11206; G11C 17/165
  USPC .......................... 438/129–132; 257/529, 530
  See application file for complete search history.

(56) References Cited

U.S. PATENT DOCUMENTS

| | | | |
|---|---|---|---|
| 7,764,536 B2 * | 7/2010 | Luo | G11C 11/1673 365/158 |
| 10,153,288 B2 * | 12/2018 | Chang | G11C 17/18 |
| 10,163,783 B1 * | 12/2018 | Chang | H01H 85/05 |
| 10,811,092 B1 * | 10/2020 | Lin | G11C 13/0026 |
| 11,004,509 B1 * | 5/2021 | Soss | G11C 13/004 |
| 2021/0408120 A1 * | 12/2021 | Lin | H01L 29/78696 |
| 2022/0122660 A1 * | 4/2022 | Nissan-Cohen | G11C 13/0097 |

* cited by examiner

*Primary Examiner* — Calvin Lee
(74) *Attorney, Agent, or Firm* — Maschoff Brennan

(57) ABSTRACT

An integrated circuit is disclosed. The integrated circuit includes a transistor, a first fuse element and a second fuse element. The transistor is formed in a first conductive layer. The first fuse element is formed in a second conductive layer disposed above the first conductive layer. The second fuse element is formed in the second conductive layer and is coupled to the first fuse element. The transistor is coupled through the first fuse element to a first data line for receiving a first data signal, and the transistor is coupled through the second fuse element to a second data line for receiving a second data signal. A method of fabricating an integrated circuit (IC) is also disclosed herein.

20 Claims, 16 Drawing Sheets

US 11,569,248 B2

INTEGRATED CIRCUIT INCLUDING EFUSE CELL

BACKGROUND

A non-volatile memory (NVM) is provided in an integrated circuit (IC). The NVM is able to retain data after the IC is turned off. Some of the NVM utilize technologies including, for example, electrical fuse (eFuse), to implement reprogram the IC.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
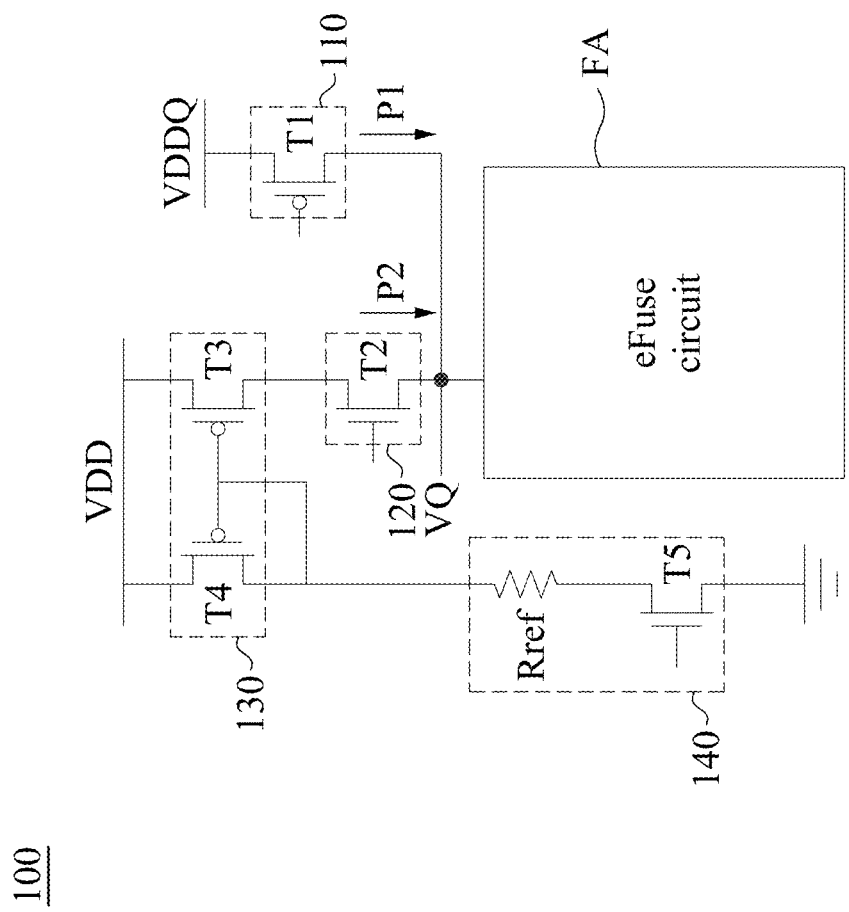
FIG. 1 is a circuit schematic diagram of a circuit, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative, and in no way limits the scope and meaning of the disclosure or of any exemplified term. Likewise, the present disclosure is not limited to various embodiments given in this specification.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

In this document, the term "coupled" may also be termed as "electrically coupled", and the term "connected" may be termed as "electrically connected". "Coupled" and "connected" may also be used to indicate that two or more elements cooperate or interact with each other.

Furthermore, spatially relative terms, such as "underlying," "below," "lower," "overlying," "upper" and the like, may be used throughout the description for ease of understanding to describe one element or feature's relationship to another element(s) or feature(s) as illustrated in the figures. The spatially relative terms are intended to encompass different orientations of the device in use or operation in addition to the orientation depicted in the figures. The structure may be otherwise oriented (e.g., rotated 90 degrees or at other orientations) and the spatially relative descriptors used herein may likewise be interpreted accordingly.

As used herein, "around", "about", "approximately" or "substantially" shall generally refer to any approximate value of a given value or range, in which it is varied depending on various arts in which it pertains, and the scope of which should be accorded with the broadest interpretation understood by the person skilled in the art to which it pertains, so as to encompass all such modifications and similar structures. In some embodiments, it shall generally mean within 20 percent, preferably within 10 percent, and more preferably within 5 percent of a given value or range. Numerical quantities given herein are approximate, meaning that the term "around", "about", "approximately" or "substantially" can be inferred if not expressly stated, or meaning other approximate values.

Reference is now made to FIG. 1. FIG. 1 is a circuit schematic diagram of a memory circuit 100, in accordance with some embodiments of the present disclosure. In some embodiments, the memory circuit 100 is also referred to a non-volatile memory (NVM) circuit.

For illustration in FIG. 1, the memory circuit 100 includes a program selection unit 110, a read selection unit 120, a sense amplifier 130, a reference circuit 140 and an electrical fuse (eFuse) circuit FA. The program selection unit 110 is coupled to the eFuse circuit FA, and is configured to receive a program signal including, for example, a program voltage VDDQ. The selection unit 120 is coupled between the sense amplifier 130 and the eFuse circuit FA, and is configured to receive a read signal including, for example, a read voltage VDD, coupled from the sense amplifier 130. The sense amplifier 130 is coupled to the selection unit 120, and is configured to receive the read signal. The eFuse circuit FA is coupled to both of the program selection unit 110 and the selection unit 120 at a node VQ. The reference circuit 140 is coupled to the sense amplifier 130.

With continued reference to FIG. 1, a program path P1 and a read path P2 are also illustrated, for programming and reading the eFuse circuit FA, respectively.

The program path P1 includes the program selection unit 110 that couples the program signal to the node VQ. In some embodiments, the program selection unit 110 includes a selection transistor T1 which, in some embodiments, is p-type metal oxide semiconductor transistors (PMOS transistor).

The read path P2 includes the read selection unit 120 and part of the sense amplifier 130 (i.e., a transistor T3 shown in FIG. 1). In some embodiments, the read selection unit 120 includes a selection transistor T2 which, in some embodiments, is n-type metal oxide semiconductor transistors (NMOS transistor). The read selection unit 120 couples the read voltage signal to the node VQ. In some embodiments, the sense amplifier 130 includes transistors T3 and T4 which, in some embodiments, are PMOS. The transistors T3 and T4 form a current mirror, and couple the read path P2 to the reference circuit 140 which includes, in some embodiments, a resistor Rref and a transistor T5.

The program path P1 and the read path P2 are selectively coupled to the node VQ by the program selection unit 110 and the read selection unit 120, based on the memory circuit 100 being in a program operation or a read operation.

In the program operation, the program selection unit 110 and the read selection unit 120 disconnects the read path P2, and couple the node VQ to the program voltage VDDQ. The program voltage VDDQ is large enough, so the program signal provides a programming current through the eFuse circuit FA, to make some eFuse of the eFuse circuit FA be blown.

In the read operation, the program selection unit 110 and the read selection unit 120 disconnects the program path P1, and couple the node VQ to the sense amplifier 130. The sense amplifier 130 determines whether a logic high (H) or a logic low (L) voltage exists at the node VQ based on the current through the eFuse circuit FA. If one eFuse of the eFuse circuit FA has been blown, the resistance of the eFuse would be large and the voltage at the node VQ would be high (i.e., H). If one eFuse of the eFuse circuit FA has not been blown, the voltage at the node VQ would be low (i.e., L).

The configuration of the memory circuit 100 as illustrated above is given for illustrative purposes. Various configurations of the memory circuit 100 are within the contemplated scope of the present disclosure. For example, in various embodiments, the program selection unit 110 is implemented by a NMOS transistor, and the read selection unit 120 is implemented by a PMOS transistor.

Figure 2:
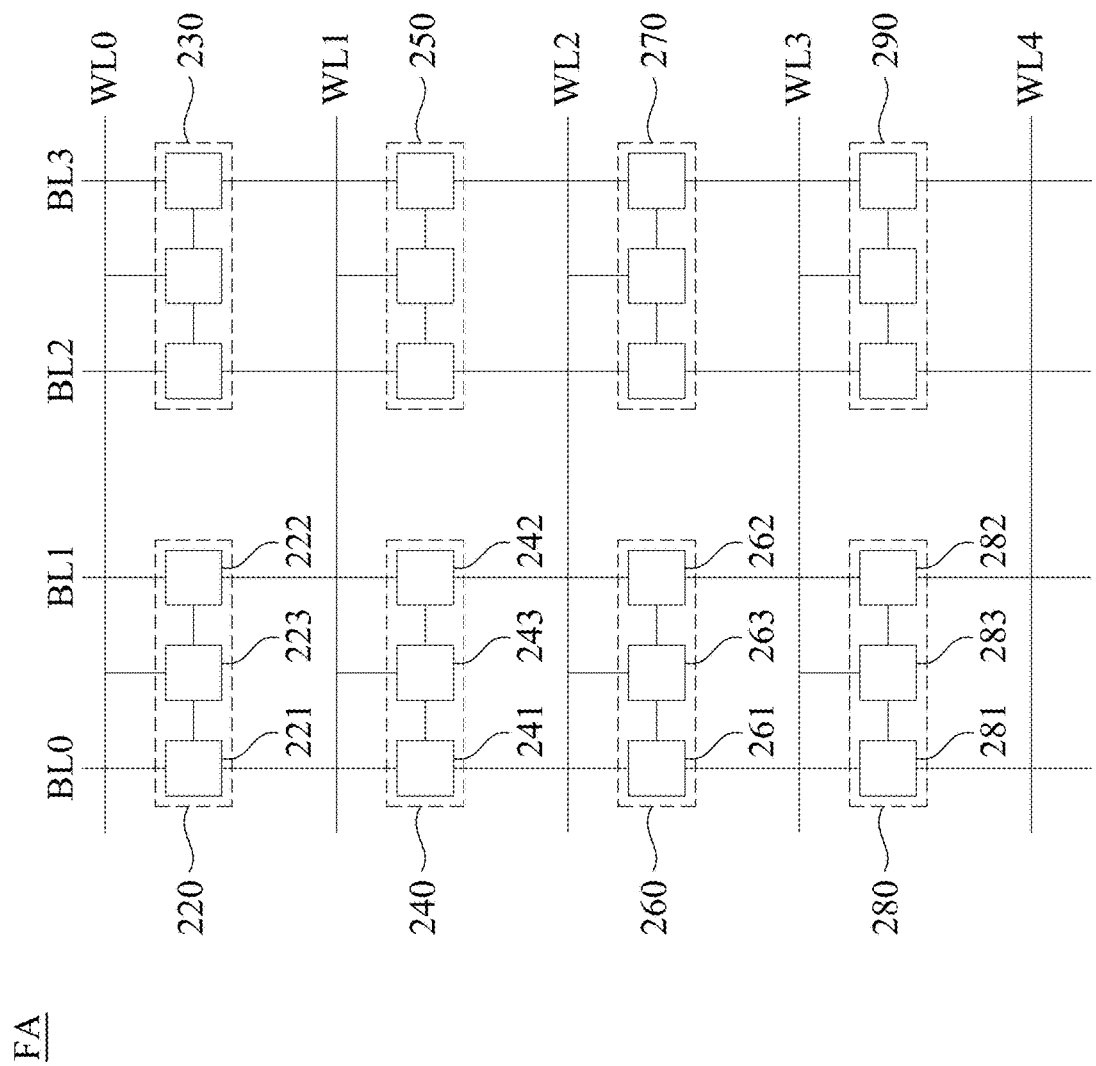
FIG. 2 is a circuit schematic diagram of an electrical fuse (eFuse) circuit corresponding to the eFuse circuit shown in FIG. 1, in accordance with some embodiments of the present disclosure.

Reference is now made to FIG. 2. FIG. 2 is a circuit schematic diagram of an eFuse circuit FA corresponding to the eFuse circuit FA shown in FIG. 1, in accordance with some embodiments of the present disclosure.

For illustration in FIG. 2, the eFuse circuit FA is arranged as an array and is arranged in rows and columns. The array is illustrated as having two columns and four rows of eFuse cells. Each rows of eFuse cells is coupled to corresponding word line including, for example of eFuse cell 220, word line WL0, and each columns of eFuse cells is coupled to respective two bit lines including, for example, bit lines BL0 and BL1. Each eFuse cells is individually accessible through the word line and the bit lines combination.

The eFuse cells included in the eFuse circuit FA shown in FIG. 2 are designated as 220, 230, 240, 250, 260, 270, 280 and 290. The eFuse cells 220, 240, 260 and 280 are arranged in one column connected to the bit line BL0 and the bit line BL1. The eFuse cells 230, 250, 270 and 290 are arranged in another column connected to the bit line BL2 and the bit line BL3. The eFuse cells 220 and 230 are arranged in one row connected to the word line WL0. Similarly, the eFuse cells 240 and 250 are arranged in the same row connected to the word line WL1, the eFuse cells 260 and 270 are arranged in the same row connected to the word line WL2, and the eFuse cells 280 and 290 are arranged in the same row connected to the word line WL3.

Each eFuse cells 220~290 includes two eFuse elements and one transistor element, and such configuration of each of eFuse cells is also indicated as 1T2R. With reference to FIG. 2, for example, the eFuse cell 220 includes the eFuse elements 221 and 222, and the transistor element 223. The eFuse elements 221 and 222 are coupled to the bit line BL0 and the bit line BL1, respectively. The transistor element 223 is coupled between the eFuse elements 221 and 222, and is further coupled to the word line WL0. Similarly, the eFuse cell 240 includes the eFuse elements 241 and 242, and the transistor element 243. The eFuse elements 241 and 242 are coupled to the bit line BL0 and the bit line BL1, respectively. The transistor element 243 is coupled between the eFuse elements 241 and 242, and is further coupled to the word line WL1. The eFuse cell 260 includes the eFuse elements 261 and 262, and the transistor element 263. The eFuse elements 261 and 262 are coupled to the bit line BL0 and the bit line BL1, respectively. The transistor element 263 is coupled between the eFuse elements 261 and 262, and is further coupled to the word line WL2. The eFuse cell 280 includes the eFuse elements 281 and 282, and the transistor element 283. The eFuse elements 281 and 282 are coupled to the bit line BL0 and the bit line BL1, respectively. The transistor element 283 is coupled between the eFuse elements 281 and 282, and is further coupled to the word line WL3.

The configuration of the eFuse circuit FA as illustrated above is given for illustrative purposes. Various configurations of the eFuse circuit FA are within the contemplated scope of the present disclosure. For example, in various embodiments, the word lines WL0, WL1, WL2, WL3 and WL4 are arranged in columns, and the bit lines BL0, BL1, BL2 and BL3 are arranged in rows.

Figure 3A:
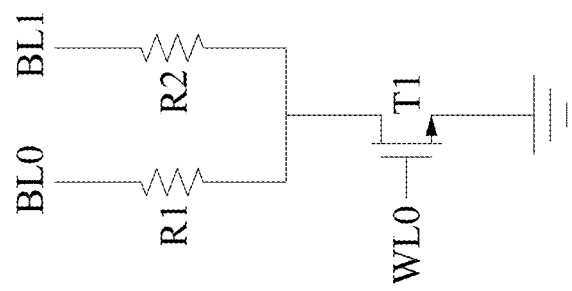
FIG. 3A is a circuit schematic diagram of an eFuse cell corresponding to one of the eFuse cells shown in FIG. 2, in accordance with some embodiments of the present disclosure.

Reference is now made to FIG. 3A. FIG. 3A is a circuit schematic diagram of an eFuse cell 300A corresponding to one of the eFuse cells including, for example, eFuse cells 220 shown in FIG. 2, in accordance with some embodiments of the present disclosure.

For illustration in FIG. 3A, the eFuse cell 300A includes a fuse R1 coupled to the bit line BL0, a fuse R2 coupled to the bit line BL1, and a transistor T1 coupled to the word line WL0. Since one transistor (i.e., the transistor T1) coupled to two fuses (i.e., the fuses R1 and R2) included in one eFuse cell (i.e., the eFuse cell 300A), the configuration of such eFuse cell is also indicated as 1T2R. Alternatively stated, for 1T2R as an eFuse cell, one word line (e.g., WL0) and two bit line (e.g, BL0 and BL1) are included in one cell, in order to operate two bits in the program operation controlled by one word line and two bit lines. In some embodiments, the fuse R1 corresponds to the eFuse element 221 shown in FIG. 2, the fuse R2 corresponds to the eFuse element 222 shown in FIG. 2, and the transistor T1 corresponds to the transistor element 223 shown in FIG. 2. Alternatively stated, the eFuse cell 300A illustrates an equivalent circuit of the eFuse cell 220.

The fuse R1 and the fuse R2 are coupled together, and each of the fuse R1 and the fuse R2 is coupled to the transistor T1 which, in some embodiments, is NMOS. Alternatively stated, the transistor T1 is coupled through the fuse R1 to the bit line BL0 for receiving data signals transmitted from the bit line BL0, and the transistor T1 is also coupled through the fuse R2 to the bit line BL1 for receiving data signals transmitted from the bit line BL1. In addition, the transistor T1 is coupled to the word line WL0 for being controlled by the word line WL0.

The above implementation of the eFuse cell 300A is provided for illustrative purposes. Various implementations of the eFuse cell 300A are within the contemplated scope of the present disclosure. For example, in addition to the transistor T1, the eFuse cell 300A includes two transistors (not shown) which, in some embodiments, are NMOS, coupled to the fuse R1 and the fuse R2 respectively. Alternatively stated, one transistor coupled between the fuse R1 and the bit line BL0, for being controlled by the bit line BL0, and the other transistor coupled between the fuse R2 and the bit line BL1, for being controlled by the bit line BL1. To explain in another way, the transistors discussed above are indicated as bit line selector transistors.

Figure 3B:
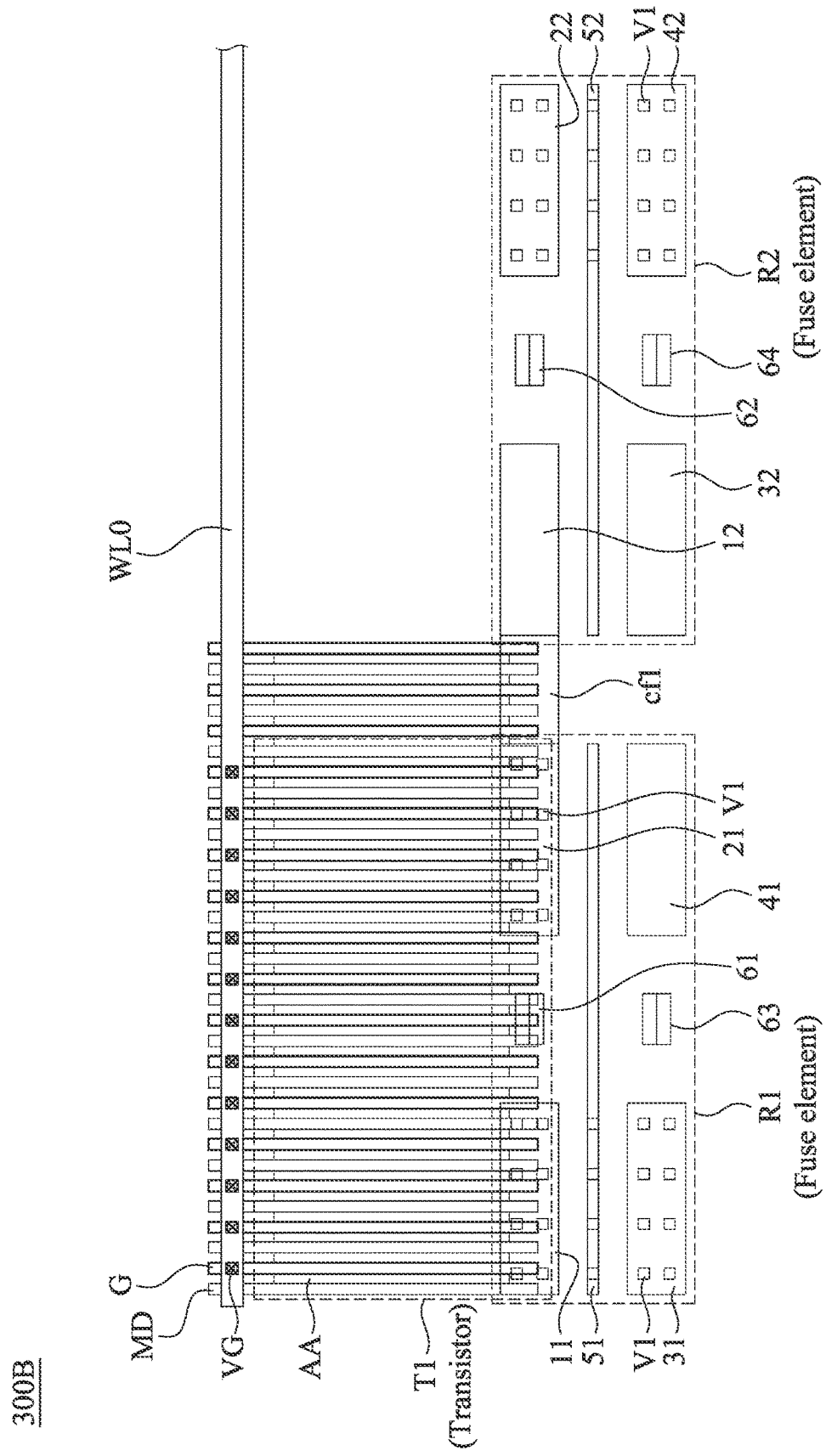
FIG. 3B is a layout structure of an eFuse cell corresponding to the eFuse cell shown in FIG. 3A, in accordance with some embodiments of the present disclosure.

Reference is now made to FIG. 3B. FIG. 3B is a layout structure 300B of an eFuse cell corresponding to the eFuse cell 300A shown in FIG. 3A, in accordance with some embodiments of the present disclosure. For illustration in FIG. 3B, the layout structure 300B includes a transistor T1, a fuse element R1 and a fuse element R2. The fuse element R1 is disposed next to the fuse element R2 in a layout view. In some embodiments, the fuse element R1 is separated apart from the fuse element R2 by a width of a fuse conductive segment cf1. In some embodiments, the fuse element R1 and the fuse element R2 are indicated as one pair of fuse element. For illustration in FIG. 3B, both of the element R1 and the fuse element R2 are arranged below the transistor T1 in the layout view. In various embodiments, the transistor T1 is partially overlapped with the fuse element R1 in the layout view. For simplicity of illustration, FIG. 3B only shows a portion of the layout structure 300B. Other elements of the layout structure 300B are within the contemplated scope of the present disclosure.

In some embodiments, the transistor T1 is also referred to at least one selection transistors including, for example, a NMOS transistor, for being controlled by the word line WL0 (which is also shown in FIG. 3A). In some embodiments, the transistor T1 corresponds to the transistor T1 shown in FIG. 3A.

Figure 5A:
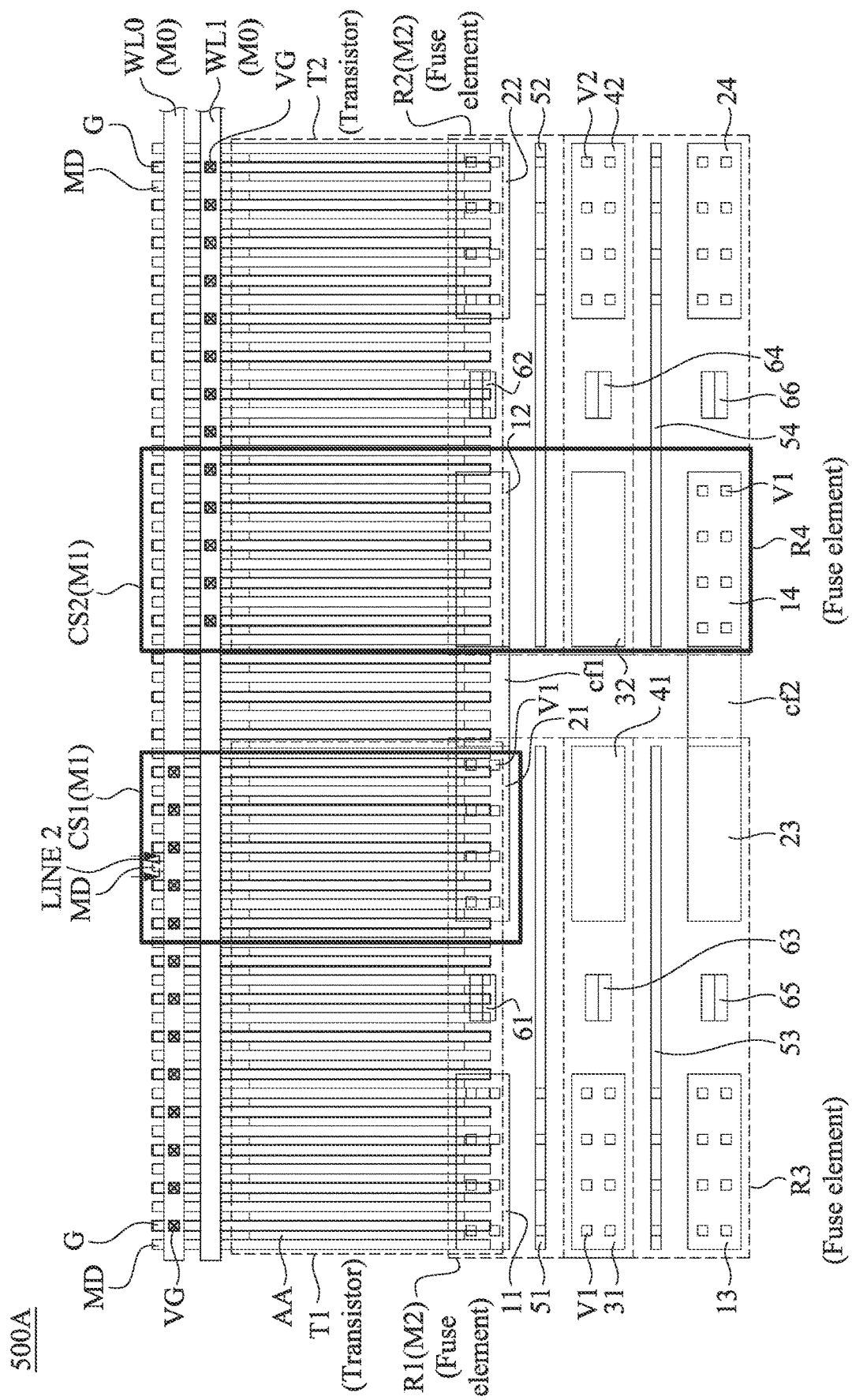
FIG. 5A is a layout structure of an eFuse cell corresponding to the eFuse cell shown in FIG. 4A, in accordance with some embodiments of the present disclosure.
Figure 5B:
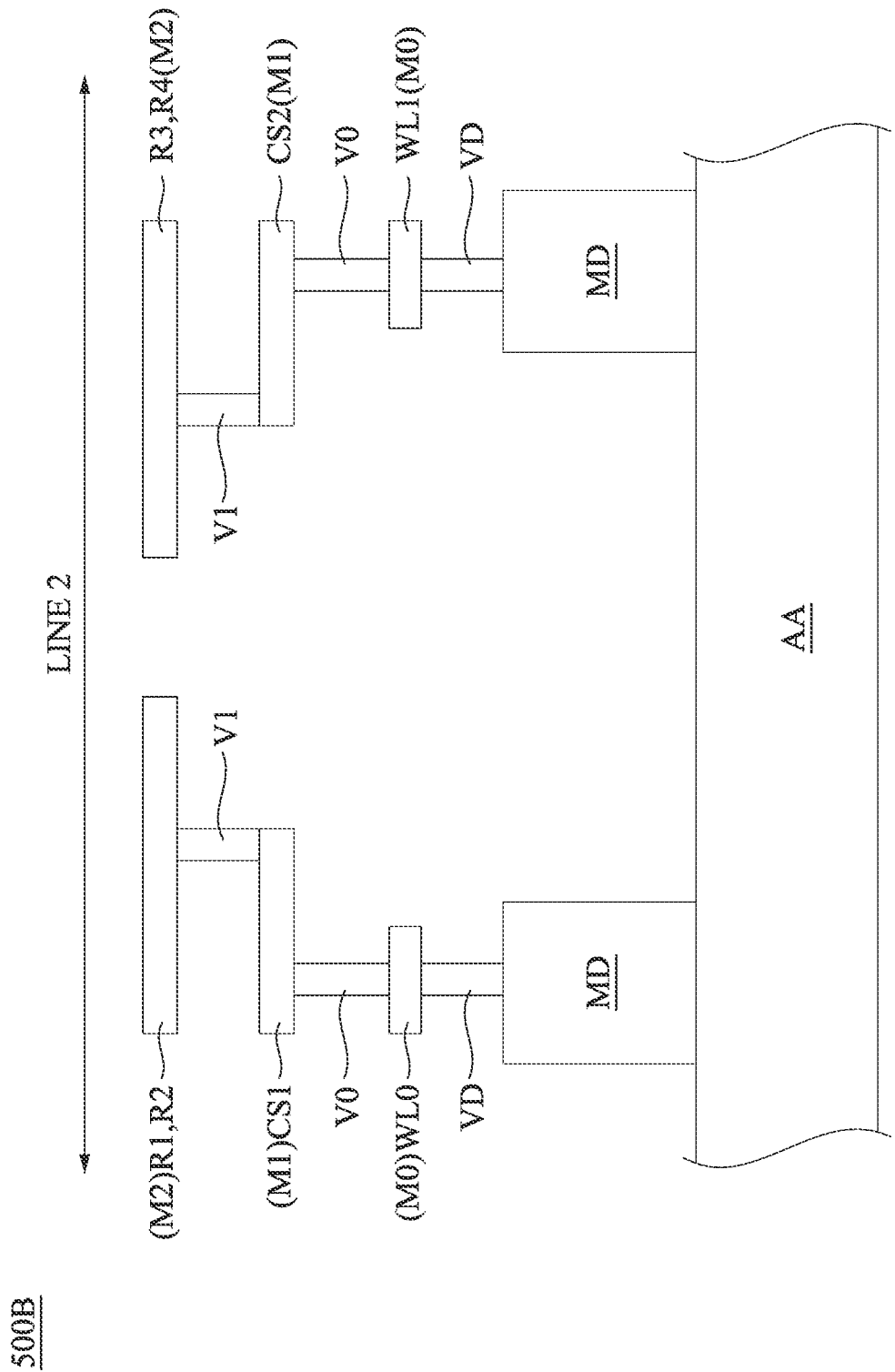
FIG. 5B is a cross-section schematic diagram of an eFuse cell corresponding to the eFuse cell shown in FIG. 5A, in accordance with some embodiments of the present disclosure.
Figure 6A:
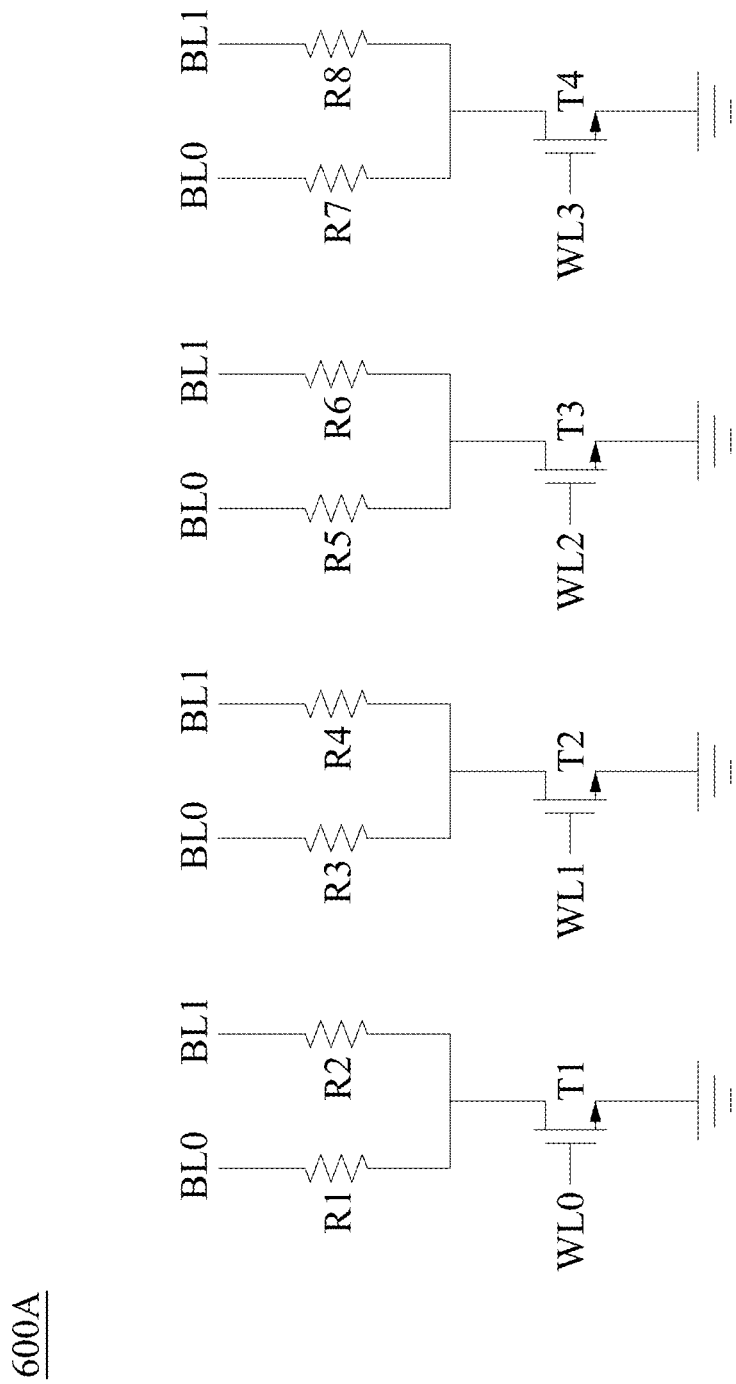
FIG. 6A is a circuit schematic diagram of an eFuse cell corresponding to the eFuse cells shown in FIG. 2, in accordance with some embodiments of the present disclosure.
Figure 6B:
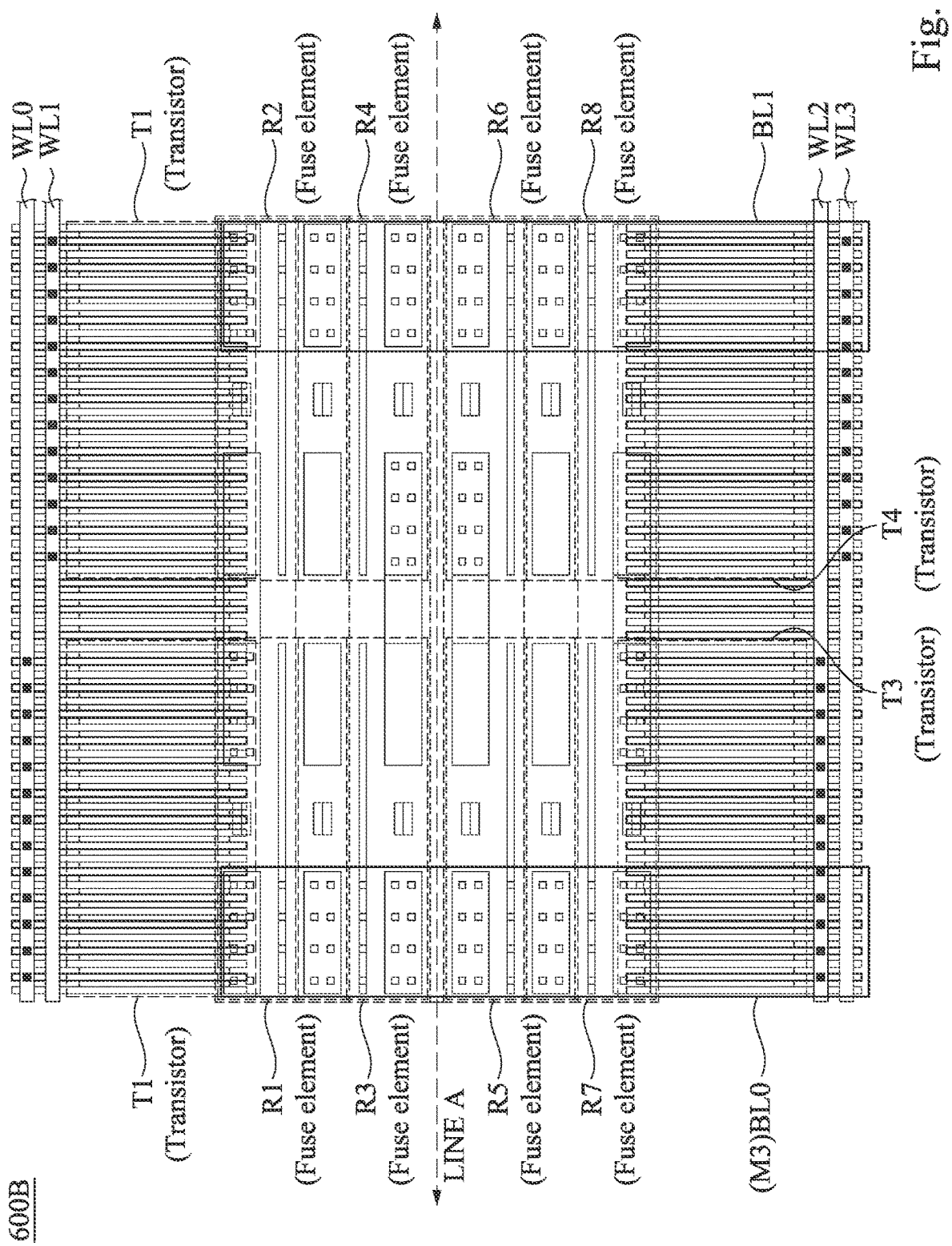
FIG. 6B is a layout structure of an eFuse cell corresponding to the eFuse cell shown in FIG. 6A, in accordance with some embodiments of the present disclosure.

In some embodiments, the fuse element R1 and the fuse element R2 are also referred to eFuses and are coupled together, for being controlled by a same transistor (i.e., the transistor T1) and also being controlled by the respective bit lines including, for example, BL0 and BL1 (which are shown in FIG. 3A or FIG. 6B). In some embodiments, the fuse element R1 corresponds to the fuse R1 shown in FIG. 3A. In other some embodiments, the fuse element R2 corresponds to the fuse R2 shown in FIG. 3A. In various embodiments, the fuse element R1 and the fuse element R2 are coupled through a conductive segment (i.e., a conductive segment CS1 which is discussed below with reference to FIGS. 5A and 5B) to the transistor T1.

With continued reference to FIG. 3B, the transistor T1 includes an active area AA, gates G and connection structures MD. The gates G are disposed above the active area AA, and the gates G extend to cross over the active area AA. The gates G are arranged separated. The connection structures MD are disposed above the active area AA, and the connection structures MD extend to cross over the active area AA. The connection structures MD and the gates G are arranged separated to each other, and are arranged alternately ordered.

The gates G and the connection structures MD are disposed below the word line WL0. Vias VG are disposed directly above the gates G, and couple the gates G to the word line WL0. The gates G are coupled to the word line WL0 through vias VG and are configured to receive data signals transmitted from the word line WL0. In some embodiments, with reference to FIG. 3B, the word line WL0 is arranged above the transistor T1 in the layout view. In some other embodiments, the word line WL0 is arranged below the transistor T1 in the layout view. In various embodiments, the vias VG are disposed above the connection structures MD, and couple the connection structures MD to the word line WL0.

In some embodiments, the gates G are polysilicon gates. the active area AA is implemented by a doped region/area, in order for the formation of the transistor T1 included in the eFuse cell 300A as shown in FIG. 3A. In some embodiments, the active region AA is made of p-type doped material. In some other embodiments, the active region AA is made of n-type doped material. In some embodiments, the active region AA is configured for forming channels of transistors. In alternative embodiments, to form fin field-effect transistors (FinFETs), the active region AA is configured for forming fin structures.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

In some embodiments, in FinFETs, the connection structures MD are also referred to as fin connection structures or fin connection layer. For simplicity of illustration, few layout structures including, for example, gates G and connection structures MD are illustrated in the transistor T1. Various layout structures in the transistor T1 are within the contemplated scope of the present disclosure.

With continued reference to FIG. 3B, the fuse element R1 includes fuse segments 11, 21, 31 and 41, a fuse line 51, and fuse walls 61 and 63. All of the fuse segments 11, 21, 31 and 41, the fuse line 51, and the fuse walls 61 and 63 are disposed in a same metal layer (i.e., the second metal layer M2 shown in FIG. 5B, which is discussed below with reference to FIGS. 5A and 5B) above the transistor T1. In some embodiments, with reference to FIG. 3B, the fuse segments 11 and 21, and the fuse wall 61 is partially overlapped with the gates G and connection structures MD in the layout view.

The fuse segments 11, 21, 31 and 41 are arranged separated from each other, and are arranged on sides of the fuse line 51. The fuse walls 61 and 63 are arranged separated from each other, and are arranged on sides of the fuse line 51. In some embodiments, the fuse segments 11 and 31 are referred as a pair of fuse segments, and are arranged on opposite sides of one end of the fuse line 51. Also, the fuse segments 21 and 41 are referred as a pair of fuse segments, and are arranged on opposite sides of the other end of the fuse line 51. In addition, the fuse walls 61 and 63 are referred as a pair of fuse walls, and are arranged on opposite sides of middle of the fuse line 51.

In the program operations, in some embodiments, the fuse line 51 is blown, and the fuse walls 61 and 63 blocks residue including, for example, metal or oxide, from the blown fuse line 51, for avoiding the residue interfering with other component of the eFuse cell.

In some embodiments, the fuse element R1 is coupled through vias V1 to the bit line BL0 (which is shown in FIG. 3A or FIG. 6B) which is disposed in another metal layer above the fuse element R1 (i.e., the third metal layer M3 which is discussed below with reference to FIG. 6B). In some embodiments, with reference to FIG. 3B, vias V1 are arranged in the fuse segments 11 and 31, and part of the fuse line 51, for coupling the fuse element R1 through the vias V1 to the bit line BL0. Alternatively stated, the transistor T1 is coupled through the fuse element R1 to vias V1, and to the bit line BL0.

With continued reference to FIG. 3B, the fuse element R2 includes fuse segments 12, 22, 32 and 42, a fuse line 52, and fuse walls 62 and 64. Similar to the fuse element R1, all of the fuse segments 12, 22, 32 and 42, the fuse line 52, and the fuse walls 62 and 64 are disposed in the same metal layer where the fuse element R1 disposed. With reference to FIG. 3B, the fuse conductive segment cf1 is arranged between the fuse segment 21 and the fuse segment 12, for coupling the fuse element R1 and the fuse element R2 to each other. In some embodiments, the fuse conductive segment cf1 is arranged directly abuts between the fuse segment 21 and the fuse segment 12. In some embodiments, the fuse conductive segment cf1 is disposed in same metal layer where the fuse elements R1-R2 are disposed. Therefore, the fuse segment 12 is coupled through the fuse conductive segment cf1 to the fuse segment 21. Alternatively stated, the fuse element R1 is coupled through the fuse conductive segment cf1 to the fuse element R2.

Similar to the fuse element R1, the fuse segments 12, 22, 32 and 42 are arranged separated from each other, and are arranged on sides of the fuse line 52. The fuse walls 62 and 64 are arranged separated from each other, and are arranged on sides of the fuse line 52. In some embodiments, the fuse segments 12 and 32 are referred as a pair of fuse segments, and are arranged on opposite sides of one end of the fuse line 52. Also, the fuse segments 22 and 42 are referred as a pair of fuse segments, and are arranged on opposite sides of the other end of the fuse line 52. In addition, the fuse walls 62 and 64 are referred as a pair of fuse walls, and are arranged on opposite sides of middle of the fuse line 52.

In the program operations, in some embodiments, the fuse line 52 is blown, and the fuse walls 62 and 64 blocks residue including, for example, metal or oxide, from the blown fuse line 52, for avoiding the residue interfering with other component of the eFuse cell.

In some embodiments, the fuse element R2 is coupled through vias V1 to the bit line BL1 (which is shown in FIG. 3A or FIG. 6B) which is disposed in the same metal layer where the bit line BL0 is disposed. In some embodiments, with reference to FIG. 3B, vias V1 are arranged in the fuse segments 22 and 42, and part of the fuse line 52, for coupling the fuse element R2 through the vias V1 to the bit line BL1. Alternatively stated, the transistor T1 is coupled through the fuse element R2 to vias V1, and to the bit line BL1.

In some approaches, an eFuse cell, corresponding to, for example, the eFuse cell 300A shown in FIG. 3A, includes one fuse coupled to one bit line and one transistor coupled to one word line. The eFuse cell is also indicated as 1T1R. A size of a layout structure of the eFuse cell is limited to metal spacing rule and gate pitch. A program path (which is discussed below with reference to FIG. 7) refers to an equivalent circuit path of the eFuse cell in program operation, and a length of the program path corresponds to the size of the layout structure. The length of the program path is effected by the size of a layout structure of the eFuse cell. A resistance of the program path corresponding to the eFuse cell increases as the length of the program path being longer, and it would cause poor performance of the eFuse cell.

Compared to the above approaches, in the embodiments of the present disclosure, for example with reference to FIGS. 3A-3B, the eFuse cell which is indicated as 1T2R may reduce the size of the corresponding layout structure by two fuses sharing one transistor. Accordingly, the resistance of the program path corresponding to the eFuse cell in the program operation may be reduced, and the performance of the eFuse cell may be enhanced.

Figure 4A:
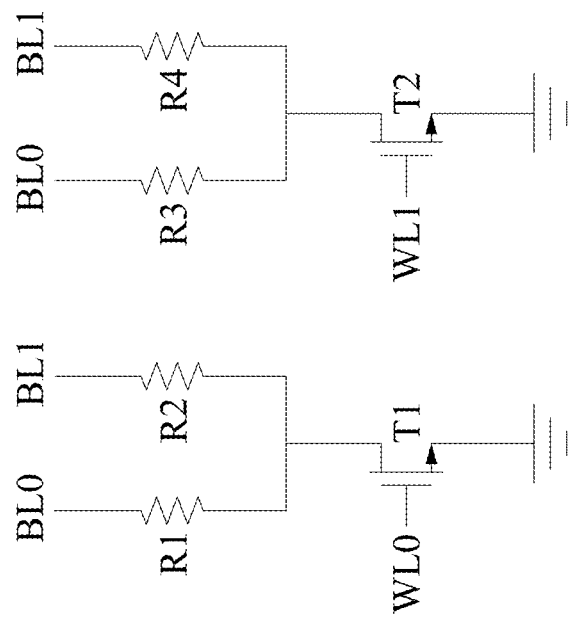
FIG. 4A is a circuit schematic diagram of an eFuse cell corresponding to the eFuse cells shown in FIG. 2, in accordance with some embodiments of the present disclosure.

Reference is now made to FIG. 4A. FIG. 4A is a circuit schematic diagram of an eFuse cell 400A corresponding to the eFuse cells including, for example, eFuse cells 220 and 240 shown in FIG. 2, in accordance with some embodiments of the present disclosure.

For illustration in FIG. 4A, the eFuse cell 400A includes a fuse R1, a fuse R2, a fuse R3, a fuse R4, a transistor T1, and a transistor T2. Since two transistors (i.e., the transistors T1 and T2) coupled to four fuses (i.e., the fuses R1-R4) included in one eFuse cell (i.e., the eFuse cell 400A), the configuration of such eFuse cell is also indicated as 2T4R. Alternatively stated, for 2T4R as an eFuse cell, two word lines (e.g., WL0 and WL1) and four bit line (e.g, BL0 and BL1) are included in one cell, in order to operate four bits in the program operation controlled by two word lines and two bit lines. In some embodiments, the fuses R1 and R2 and the transistor T1 are the same as those of the eFuse cell 300A shown in FIG. 3A. Accordingly, they are not further detailed herein.

Compared to the eFuse cell 300A, the eFuse cell 400A further includes the fuse R3 coupled to the bit line BL0, the fuse R4 coupled to the bit line BL1, and the transistor T2 coupled to the word line WL1. In some embodiments, the fuse R3 corresponds to the eFuse element 241 shown in FIG. 2, the fuse R4 corresponds to the eFuse element 242 shown in FIG. 2, and the transistor T2 corresponds to the transistor element 243 shown in FIG. 2. Alternatively stated, the eFuse cell 400A illustrates an equivalent circuit of the eFuse cells 220 and 240.

Similar to the fuses R1 and R2, the fuse R3 and the fuse R4 are coupled together, and each of the fuse R3 and the fuse R4 is coupled to the transistor T2 which, in some embodiments, is NMOS. Alternatively stated, the transistor T2 is coupled through the fuse R3 to the bit line BL0 for receiving data signals transmitted from the bit line BL0, and the transistor T2 is also coupled through the fuse R4 to the bit line BL1 for receiving data signals transmitted from the bit line BL1. In addition, the transistor T2 is coupled to the word line WL1 for being controlled by the word line WL1. In some embodiments, the transistors T1 and T2 have the same configuration or structure, and the fuses R1-R4 have the same configuration or structure.

The above implementation of the eFuse cell 400A is provided for illustrative purposes. Various implementations of the eFuse cell 400A are within the contemplated scope of the present disclosure. For example, the transistors T1 and T2 are implemented by PMOS.

Figure 4B:
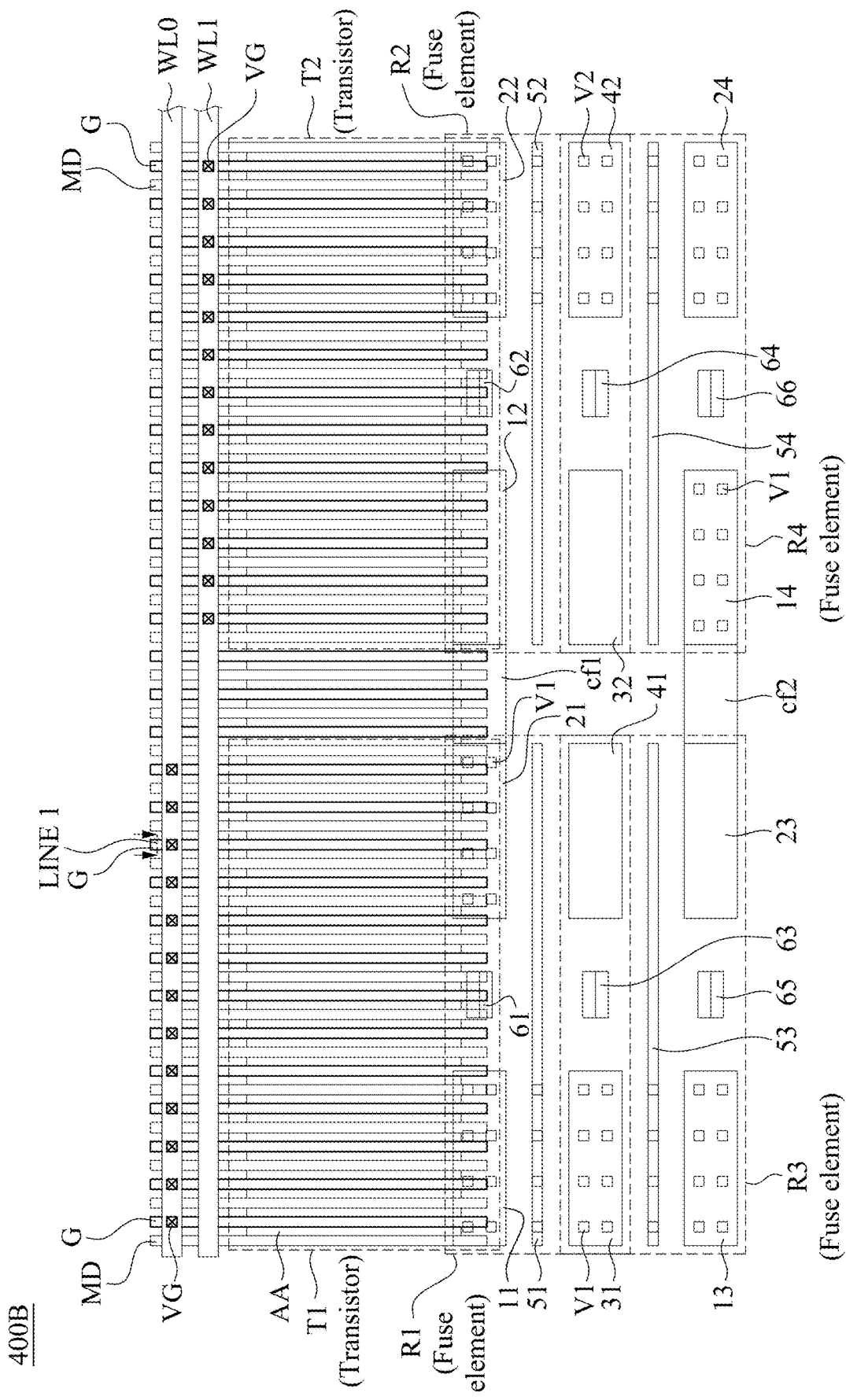
FIG. 4B is a layout structure of an eFuse cell corresponding to the eFuse cell shown in FIG. 4A, in accordance with some embodiments of the present disclosure.

Reference is now made to FIG. 4B. FIG. 4B is a layout structure 400B of an eFuse cell corresponding to the eFuse cell 400A shown in FIG. 4A, in accordance with some embodiments of the present disclosure. For illustration in FIG. 4B, the layout structure 400B includes a transistor T1, a fuse element R1, a fuse element R2, a transistor T2, a fuse element R3 and a fuse element R4. In some embodiments, the layout structure 400B is symmetric with respect to horizontal direction in the layout view. In some embodiments, the fuse elements R1 and R2 and the transistor T1 are the same as those of the layout structure 300B shown in FIG. 3B. In some embodiments, the transistor T2 has the same structure as the transistor T1. Accordingly, they are not further detailed herein.

Figure 4C:
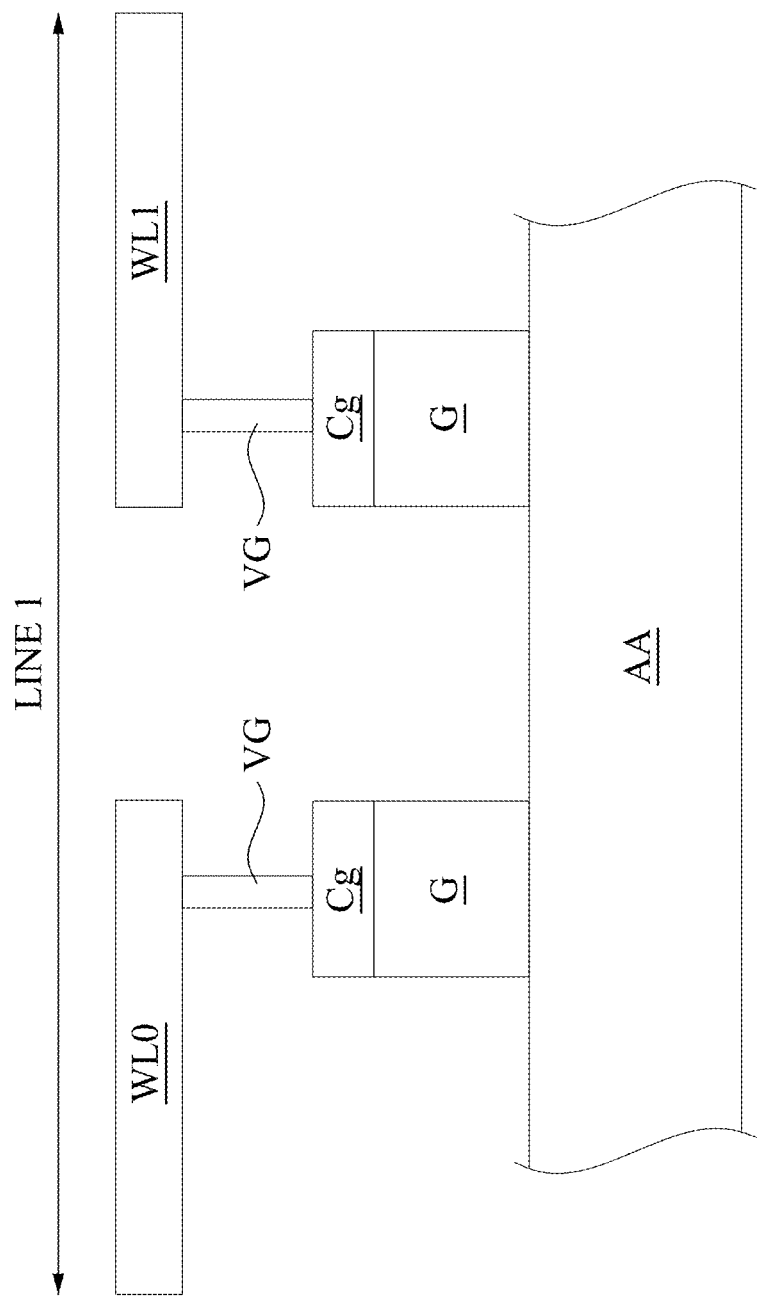
FIG. 4C is a cross-section schematic diagram of an eFuse cell corresponding to the eFuse cell shown in FIG. 4B, in accordance with some embodiments of the present disclosure.

FIG. 4C is a schematic diagram 400C illustrating a cross-section view, viewing at a cross line LINE 1 of one of the gates G of the transistor T1 shown in FIG. 4B, in accordance with some embodiments of the present disclosure. For ease of understanding, the embodiments with respect to FIG. 4C are discussed with reference to FIG. 4B.

The gates G are disposed above and across over the active area AA in the layout view of the layout structure 400B, as well as shown in FIG. 4C. In some embodiments, the vias VG are disposed above and overlap the gates G, in the layout view of the layout structure 400B, as well as shown in FIG. 4C. Accordingly, in FIG. 4C, the schematic diagram 400C only illustrates two gates G and the corresponding two vias VG disposed above the active area AA, for simplicity of illustration. In some embodiments, gate segments Cg are disposed above and overlap the gates G in the layout view, which is only shown in FIG. 4C and not shown in FIG. 4B for simplicity. In various embodiments, the gate segments Cg are configured to couple the gates G through the vias VG to the word line WL0 or WL1. However, the present disclosure is not limited to the embodiments of FIGS. 4B-4C. Various positions or numbers of the vias VG are within the contemplated scope of the present disclosure.

The word lines WL0 and WL1 are disposed above and across over the gates G and the connection structures MD in the layout view of the layout structure 400B, as well as shown in FIG. 4C. In some embodiments, the word lines WL0 and WL1 are formed in a metal-zero (M0) layer, which is disposed above the gates G, the connection structures MD, and the active area AA. In some embodiments, the word lines WL0 and WL1 are coupled through the vias VG to the gates G or the connection structures MD. For example, with reference to FIG. 4C, the word line WL0 is configured to couple through the via VG to the gate G of the transistor T1 (which is shown in FIG. 4B), and the word line WL1 is configured to couple through the via VG to the gate G of the transistor T2 (which is shown in FIG. 4B).

Compared to the layout structure 300B, the layout structure 400B further includes a transistor T2, a fuse element R3 and a fuse element R4. The transistor T2 is arranged next to the transistor T1 in the layout view. The transistor T2 is arranged apart from the fuse elements R3 and R4 in the layout view.

The fuse element R3 is arranged next to the fuse element R4 in the layout view. In some embodiments, the fuse element R3 is separated apart from the fuse element R4 by a width of a fuse conductive segment cf2. In some embodiments, the fuse element R3 and the fuse element R4 are indicated as one pair of fuse element different from the other pair of fuse element including the fuse elements R1-R2. For illustration in FIG. 3B, both of the element R3 and the fuse element R4 are arranged below the transistors T1 and T2 in the layout view. Alternatively stated, both of the element R3 and the fuse element R4 are arranged apart from the transistors T1 and T2 in the layout view. To explain in another way, all of the fuse elements R1-R4 are arranged as an array and are arranged below the transistors T1 and T2 in the layout view. For simplicity of illustration, FIG. 4B only shows a portion of the layout structure 400B. Other elements of the layout structure 400B are within the contemplated scope of the present disclosure.

In some embodiments, the transistor T2 has the similar function as the transistor T1, and is also referred to at least one selection transistors including, for example, a NMOS transistor, for being controlled by the word line WL1. In some embodiments, the transistor T2 corresponds to the transistor T2 shown in FIG. 4A.

In some embodiments, the fuse elements R3 and R4 have the similar function as the fuse elements R1 and R2. The fuse element R3 and the fuse element R4 are also referred to eFuses and are coupled together, for being controlled by a same transistor (e.g., the transistor T2) and also being controlled by respectively the bit lines including, for example, BL0 and BL1 (which are shown in FIG. 4A). In some embodiments, the fuse element R3 corresponds to the fuse R3 shown in FIG. 3A. In other some embodiments, the fuse element R4 corresponds to the fuse R4 shown in FIG. 3A. In various embodiments, the fuse element R3 and the fuse element R4 are coupled through a conductive segment (i.e., a conductive segment CS2 which is discussed below with reference to FIGS. 5A and 5B) to the transistor T2.

With continued reference to FIG. 4B, the gates G of the transistor T2 are coupled to the word line WL1 through vias VG and are configured to receive data signals transmitted from the word line WL1. In some embodiments, with reference to FIG. 4B, the word line WL1 is arranged next to the word line WL0, and the word lines WL0 and WL1 are arranged above the transistors T1 and T2 in the layout view. In various embodiments, the word lines WL0 and WL1 are arranged below the transistors T1 and T2 in the layout view. In some embodiments, with reference to FIG. 4B, the gates G and connection structures MD of the transistor T2 is partially overlapped with the fuse segments 12 and 22, and the fuse wall 62 in the layout view.

With continued reference to FIG. 4B, the fuse element R3 includes fuse segments 13, 23, 31 and 41, a fuse line 53, and fuse walls 63 and 65. The fuse element R3 and the fuse element R1 share at least one of adjacent fuse segments or adjacent fuse walls, including, for example, the fuse segments 31 and 41, and the fuse wall 63. Similar to the fuse elements R1-R2, all of the fuse segments 13, 23, 31 and 41, the fuse line 53, and the fuse walls 63 and 65 are disposed in the same metal layer where the fuse elements R1 and R2 disposed.

Similar to the fuse elements R1-R2, the fuse segments 13, 23, 31 and 41 are arranged separated from each other, and are arranged on sides of the fuse line 53. The fuse walls 63 and 65 are arranged separated from each other, and are arranged on sides of the fuse line 53. In some embodiments, the fuse segments 31 and 13 are referred as a pair of fuse segments, and are arranged on opposite sides of one end of the fuse line 53. Also, the fuse segments 41 and 23 are referred as a pair of fuse segments, and are arranged on opposite sides of the other end of the fuse line 53. In addition, the fuse walls 63 and 65 are referred as a pair of fuse walls, and are arranged on opposite sides of middle of the fuse line 53.

In the program operations, in some embodiments, the fuse line 53 is blown, and the fuse walls 63 and 65 blocks residue including, for example, metal or oxide, from the blown fuse line 53, for avoiding the residue interfering with other component of the eFuse cell including, for example, the fuse element R1.

In some embodiments, the fuse element R3 is coupled through vias V1 to the bit line BL0 (which is shown in FIG. 4A) which is disposed in the same metal layer where the bit line BL0 is disposed. In some embodiments, with reference to FIG. 4B, vias V1 are arranged in the fuse segments 13 and 31, and part of the fuse line 53, for coupling the fuse element R3 through the vias V1 to the bit line BL0. Alternatively stated, the transistor T2 is coupled through the fuse element R3 to vias V1, and to the bit line BL0.

With continued reference to FIG. 4B, the fuse element R4 includes fuse segments 14, 24, 32 and 42, a fuse line 54, and fuse walls 64 and 66. The fuse element R4 and the fuse element R2 share at least one of adjacent fuse segments or adjacent fuse walls, including, for example, the fuse segments 32 and 42, and the fuse wall 64. Similar to the fuse elements R1-R3, all of the fuse segments 14, 24, 32 and 42, the fuse line 54, and the fuse walls 64 and 66 are disposed in the same metal layer where the fuse elements R1-R3 disposed. With reference to FIG. 4B, the fuse conductive segment cf2 is arranged between the fuse segment 23 and the fuse segment 14, for coupling the fuse element R3 and the fuse element R4 to each other. In some embodiments, the fuse conductive segment cf2 is arranged directly abuts between the fuse segment 23 and the fuse segment 14. In some embodiments, the fuse conductive segment cf2 is disposed in same metal layer where the fuse elements R1-R4 are disposed. Therefore, the fuse segment 23 is coupled through the fuse conductive segment cf2 to the fuse segment 14. Alternatively stated, the fuse element R3 is coupled through the fuse conductive segment cf2 to the fuse element R4. In some embodiments, the conductive segment cf1 and the conductive segment cf2 have the same layout structure.

Similar to the fuse elements R1-R3, the fuse segments 14, 24, 32 and 42 are arranged separated from each other, and are arranged on sides of the fuse line 54. The fuse walls 64 and 66 are arranged separated from each other, and are arranged on sides of the fuse line 54. In some embodiments, the fuse segments 32 and 14 are referred as a pair of fuse segments, and are arranged on opposite sides of one end of the fuse line 54. Also, the fuse segments 42 and 24 are referred as a pair of fuse segments, and are arranged on opposite sides of the other end of the fuse line 54. In addition, the fuse walls 64 and 66 are referred as a pair of fuse walls, and are arranged on opposite sides of middle of the fuse line 54.

In the program operations, in some embodiments, the fuse line 54 is blown, and the fuse walls 64 and 66 blocks residue including, for example, metal or oxide, from the blown fuse line 54, for avoiding the residue interfering with other component of the eFuse cell including, for example, the fuse element R2.

In some embodiments, the fuse element R4 is coupled through vias V1 to the bit line BL1 (which is shown in FIG. 4A) which is disposed in the same metal layer where the bit line BL0 is disposed. In some embodiments, with reference to FIG. 4B, vias V1 are arranged in the fuse segments 24 and 42, and part of the fuse line 54, for coupling the fuse element R4 through the vias V1 to the bit line BL1. Alternatively stated, the transistor T2 is coupled through the fuse element R4 to vias V1, and to the bit line BL1.

Reference is now made to FIG. 5A. FIG. 5A is a layout structure 500A of an eFuse cell corresponding to the eFuse cell 400A shown in FIG. 4A, in accordance with some embodiments of the present disclosure. In some embodiments, the fuse elements R1-R4 and the transistors T1-T2 are the same as those of the layout structure 400B shown in FIG. 4B. Accordingly, they are not further detailed herein.

FIG. 5B is a schematic diagram 500B illustrating a cross-section view, viewing at a cross line LINE 2 of one of the connection structures MD of the transistor T1 shown in FIG. 5A, in accordance with some embodiments of the present disclosure. For ease of understanding, the embodiments with respect to FIG. 5B are discussed with reference to FIG. 5A.

Compared to the layout structure 400B, the layout structure 500A further includes the conductive segment CS1 and the conductive segment CS2.

The connection structures MD are disposed above and across over the active area AA in the layout view of the layout structure 500A, as well as shown in FIG. 5B. In some embodiments, the vias VD are disposed above and overlap the connection structures MD, which is only shown in FIG. 5B and not shown in FIG. 5A for simplicity. Accordingly, in FIG. 5B, the schematic diagram 500B only illustrates two connection structures MD and the corresponding two vias VD disposed above the active area AA, for simplicity of illustration. However, the present disclosure is not limited to the embodiments of FIGS. 5A-5B. Various positions or numbers of the vias VG are within the contemplated scope of the present disclosure.

The word lines WL0 and WL1 are disposed above and across over the gates G and the connection structures MD in the layout view of the layout structure 500A, as well as shown in FIG. 5B. In some embodiments, the word lines WL0 and WL1 are formed in a metal-zero (M0) layer, which is disposed above the gates G, the connection structures MD, and the active area AA. In some embodiments, the word lines WL0 and WL1 are coupled through the vias VD to the connection structures MD. For example, with reference to FIG. 5B, the word line WL0 is configured to couple through the via VD to the connection structures MD of the transistor T1 (which is shown in FIG. 5A), and the word line WL1 is configured to couple through the via VD to the connection structures MD of the transistor T2 (which is shown in FIG. 5A).

For illustration in FIG. 5A, the conductive segment CS1 is disposed above and across over the part of the gates G and connection structures MD of the transistor T1 in the layout view of the layout structure 500A, as well as shown in FIG. 5B. In some embodiments, the conductive segment CS1 is formed in a first metal (M1) layer, which is disposed above the M0 layer. In some embodiments, the conductive segment CS1 is coupled through the vias V0 (not shown in FIG. 5A) to the word line WL0, and through the vias VD to the connection structures MD of the transistor T1. Alternatively stated, the transistor T1 is coupled through the vias VD to the word line WL0, and through the vias V0 to the conductive segment CS1.

Furthermore, the conductive segment CS1 is also disposed above and partially overlapped with the fuse element R1 in the layout view of the layout structure 500A, as well as shown in FIG. 5B. Specifically, the conductive segment CS1 is overlapped with the fuse segment 21 of the fuse element R1. In some embodiments, the fuse element R1 is formed in a second metal (M2) layer, which is disposed above the M1 layer. In some embodiments, the conductive segment CS1 is coupled through the vias V1 to fuse element R1. Alternatively stated, the fuse element R1 is coupled through the vias V1 to the conductive segment CS1.

Therefore, the fuse element R1 is coupled through the vias V1 to the conductive segment CS1, through the vias V0 to the word line WL0, and through the vias VD to the connection structures MD of the transistor T1. Alternatively stated, the transistor T1 is coupled through the vias VD to the word line WL0, through the vias V0 to the conductive segment CS1, and through the vias V1 to the fuse element R1. Based on the above discussion, since the fuse element R1 is coupled to the fuse element R2, the transistor T1 is also coupled to the fuse element R2 by the same path as coupled to the fuse element R1.

With continued reference to FIG. 5A, the conductive segment CS2 is disposed above and across over the part of the gates G and connection structures MD of the transistor T2 in the layout view of the layout structure 500A, as well as shown in FIG. 5B. In some embodiments, the conductive segment CS2 is formed in the M1 layer. In some embodiments, the conductive segment CS1 is coupled through the vias V0 (not shown in FIG. 5A) to the word line WL1, and through the vias VD to the connection structures MD of the transistor T2. Alternatively stated, the transistor T2 is coupled through the vias VD to the word line WL1, and through the vias V0 to the conductive segment CS2.

In addition, the conductive segment CS2 is also disposed above and partially overlapped with the fuse elements R2 and R4 in the layout view of the layout structure 500A, as well as shown in FIG. 5B. Specifically, the conductive segment CS2 is overlapped with the fuse segments 12 and 32 and part of the fuse line 52 of the fuse element R2, and is also overlapped with the fuse segments 14 and 32 and part of the fuse line 54 of the fuse element R4. In some embodiments, the fuse elements R1-R4 are formed in the M2 layer. In some embodiments, the conductive segment CS2 is coupled through the vias V1 to fuse element R4. Alternatively stated, the fuse element R4 is coupled through the vias V1 to the conductive segment CS2.

Therefore, the fuse element R4 is coupled through the vias V1 to the conductive segment CS2, through the vias V0 to the word line WL1, and through the vias VD to the connection structures MD of the transistor T2. Alternatively stated, the transistor T2 is coupled through the vias VD to the word line WL1, through the vias V0 to the conductive segment CS2, and through the vias V1 to the fuse element R4. Based on the above discussion, since the fuse element R4 is coupled to the fuse element R3, the transistor T2 is also coupled to the fuse element R3 by the same path as coupled to the fuse element R2.

In some embodiments, a length of the conductive segment CS1 and a length of the conductive segment CS2 are different. In some embodiments, with continued reference to FIG. 5A, the length of the conductive segment CS1 is shorter than the length of the conductive segment CS2. In some other embodiments, a width of the conductive segment CS1 and a width of the conductive segment CS2 are different. In some embodiments, with continued reference to FIG. 5A, the width of the conductive segment CS1 is equal to the width of the conductive segment CS2.

In some embodiments, the conductive segments CS1 and CS2 are formed in the same metal layer, for example, with reference to FIG. 5B, in the M1 layer. In some other embodiments, the conductive segments CS1 and CS2 are formed in different metal layer, for example, the conductive segment CS1 formed in the M1 layer and the conductive segment CS2 formed in the M2 layer. In various embodiments, the transistor T1 is coupled to the fuse elements R1 and R2 without the conductive segment CS1, and the transistor T2 is coupled to the fuse elements R3 and R4 without the conductive segment CS2.

In some approaches, an eFuse cell, corresponding to, for example, the eFuse cell 400A shown in FIG. 4A, includes two fuses coupled to two bit lines respectively, and two transistor coupled to two word lines respectively. Each of the transistors is coupled to one fuse, and such eFuse cell is also indicated as 2T2R. The size of a layout structure of the eFuse cell is limited to design rule including, for example, metal spacing rule of fuse and gate pitch of transistor, and it leads to increase the length of the program path (which is discussed below with reference to FIG. 7). The resistance of the program path corresponding to the eFuse cell increases since then, and it would cause poor performance of the eFuse cell.

Compared to the above approaches, in the embodiments of the present disclosure, for example with reference to FIGS. 4A-5B, the eFuse cell which is indicated as 2T4R may reduce the size of the corresponding layout structure by four fuses sharing two transistor correspondingly, and by double word lines arrangement. Accordingly, the configuration of the layout structure is optimized to implement the eFuse cell, and the resistance of the program path corresponding to the eFuse cell in the program operation may be reduced by the reduction of the eFuse cell size, and the performance of the eFuse cell may be further enhanced.

Reference is now made to FIG. 6A. FIG. 6A is a circuit schematic diagram of an eFuse cell 600A corresponding to the eFuse cells including, for example, eFuse cells 220, 240, 260 and 280 shown in FIG. 2, in accordance with some embodiments of the present disclosure.

For illustration in FIG. 6A, the eFuse cell 600A includes fuses R1-R8 and transistors T1-T4. Since four transistors (i.e., the transistors T1-T4) coupled to eight fuses (i.e., the fuses R1-R8) included in one eFuse cell (i.e., the eFuse cell 600A), the configuration of such eFuse cell is also indicated as 4T8R. Alternatively stated, for 4T8R as an eFuse cell, four word lines (e.g., WL0-WL3) and two bit lines (e.g, BL0 and BL1) are included in one cell, in order to operate eight bits in the program operation controlled by four word lines and two bit lines. In some embodiments, the fuses R1-R4 and the transistors T1-T2 are the same as those of the eFuse cell 400A shown in FIG. 4A. Accordingly, they are not further detailed herein.

Compared to the eFuse cell 400A, the eFuse cell 600A further includes the fuse R5 coupled to the bit line BL0, the fuse R6 coupled to the bit line BL1, and the transistor T3 coupled to the word line WL2. In addition, the eFuse cell 600A further includes the fuse R7 coupled to the bit line BL0, the fuse R8 coupled to the bit line BL1, and the transistor T4 coupled to the word line WL3. In some embodiments, the fuse R5 corresponds to the eFuse element 261 shown in FIG. 2, the fuse R6 corresponds to the eFuse element 262 shown in FIG. 2, and the transistor T3 corresponds to the transistor element 263 shown in FIG. 2. In some embodiments, the fuse R7 corresponds to the eFuse element 281 shown in FIG. 2, the fuse R8 corresponds to the eFuse element 282 shown in FIG. 2, and the transistor T4 corresponds to the transistor element 283 shown in FIG. 2. Alternatively stated, the eFuse cell 600A illustrates an equivalent circuit of the eFuse cells 220, 240, 260 and 280.

Similar to the eFuse cell 400A discussed above, one transistor is coupled to two fuses, for example, the fuses R5 and R6 are coupled together, and each of them is coupled to the transistor T3 which, in some embodiments, is NMOS. The fuses R7 and R8 are coupled together, and each of them is coupled to the transistor T4 which, in some embodiments, is NMOS. Alternatively stated, the transistor T3 is coupled through the fuse R5 to the bit line BL0, and the transistor T3 is also coupled through the fuse R6 to the bit line BL1. In addition, the transistor T3 is coupled to the word line WL2. The transistor T4 is coupled through the fuse R7 to the bit line BL0, and the transistor T4 is also coupled through the fuse R8 to the bit line BL1. In addition, the transistor T4 is coupled to the word line WL3.

The above implementation of the eFuse cell 600A is provided for illustrative purposes. Various implementations of the eFuse cell 600A are within the contemplated scope of the present disclosure. For example, the transistors T1-T4 are implemented by PMOS.

Reference is now made to FIG. 6B. FIG. 6B is a layout structure 600B of an eFuse cell corresponding to the eFuse cell 600A shown in FIG. 6A, in accordance with some embodiments of the present disclosure. For illustration in FIG. 6B, the layout structure 600B includes transistors T1-T4, fuse elements R1-R8. In some embodiments, the fuse elements R1 and R2 and the transistor T1 are the same as those of the layout structure 300B shown in FIG. 3B, and are also the same as those of the layout structure 400B shown in FIG. 4B or the layout structure 500A shown in FIG. 5A. In some embodiments, the fuse elements R3 and R4 and the transistor T2 are the same as those of the layout structure 400B shown in FIG. 4B or the layout structure 500A shown in FIG. 5A. In some embodiments, the transistors T1-T4 have the same structure as discussed above, and the fuse elements R1-R8 have the same structure as well as discussed above. Accordingly, they are not further detailed herein.

Compared to the layout structure 500A, the layout structure 600B further includes transistors T3-T4 and fuse elements R5-R8. The transistors T3-T4 are arranged apart from the transistors T1-T2 and the fuse elements R1-R5 in the layout view. The transistor T3 is arranged next to the fuse elements R7, and the transistor T4 is arranged next to the fuse elements R8.

The fuse element R5 is arranged next to the fuse element R6 in the layout view. In some embodiments, the fuse element R5 is separated apart from the fuse element R6 by a width of a fuse conductive segment (which is discussed above with reference to FIG. 3B, 4B or 5A). In some embodiments, the fuse element R5 and the fuse element R6 are indicated as one pair of fuse element. For illustration in FIG. 6B, the fuse element R5 is arranged between the fuse element R3 and the fuse element R7, and the fuse element R6 is arranged between the fuse element R4 and the fuse element R8. In addition, the elements R5 and R6 are arranged below the transistors T1 and T2, and are arranged above the transistors T3 and T4, in the layout view. Alternatively stated, both of the element R5 and the fuse element R6 are arranged apart from the transistors T1-T4 in the layout view.

The fuse element R7 is arranged next to the fuse element R8 in the layout view. In some embodiments, the fuse element R7 is separated apart from the fuse element R8 by a width of a fuse conductive segment (which is discussed above with reference to FIG. 3B, 4B or 5A). In some embodiments, the fuse element R7 and the fuse element R8 are indicated as one pair of fuse element. For illustration in FIG. 6B, the fuse element R7 is arranged next to the transistor T3, and the fuse element R8 is arranged next to the transistor T4. In addition, the elements R5 and R6 are arranged below the transistors T1 and T2, and are arranged above the transistors T3 and T4, in the layout view. Alternatively stated, both of the element R5 and the fuse element R6 are arranged apart from the transistors T1-T4 in the layout view. To explain in another way, all of the fuse elements R1-R8 are arranged as an array and are arranged surrounded by the transistors T1-T4 in the layout view. For simplicity of illustration, FIG. 6B only shows a portion of the layout structure 600B. Other elements of the layout structure 600B are within the contemplated scope of the present disclosure.

In some embodiments, with reference is to FIG. 6B, the layout structure 600B is symmetrical with respect to the line A, except for some vias VG disposed in the word lines W10-WL3.

In some approaches, an eFuse cell, corresponding to, for example, the eFuse cell 600A shown in FIG. 6A, includes four fuses coupled to four bit lines respectively, and four transistor coupled to four word lines respectively. Each of the transistors is coupled to one fuse, and such eFuse cell is also indicated as 4T4R. As discussed above with reference to other some approaches, the resistance of the eFuse cell in program operation increases, and the performance of the eFuse cell decreases accordingly.

Compared to the above approaches, in the embodiments of the present disclosure, for example with reference to FIGS. 6A-6B, the eFuse cell which is indicated as 4T8R may reduce the size of the corresponding layout structure by eight fuses sharing four transistor correspondingly, and by double word lines arrangement. Furthermore, for one eFuse cell, it may program eight bits at once. Accordingly, the configuration of the layout structure is optimized to implement the eFuse cell, and the resistance of the program path corresponding to the eFuse cell in the program operation may be reduced, and the performance of the eFuse cell may be further enhanced.

Figure 7:
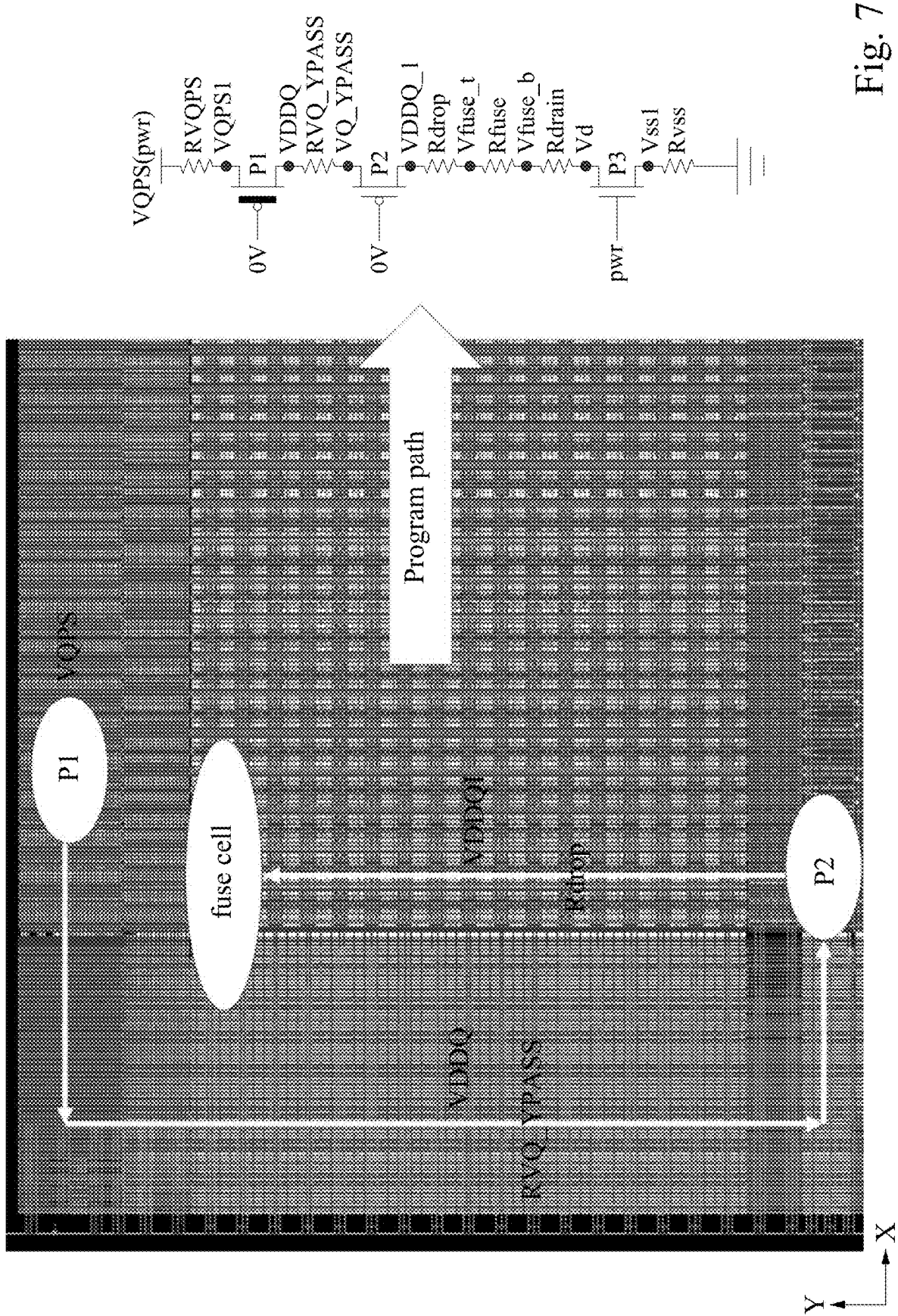
FIG. 7 is a schematic diagram of a circuit path for an eFuse cell corresponding to the eFuse cells shown in FIG. 2, in accordance with some embodiments of the present disclosure.

Reference is now made to FIG. 7. FIG. 7 is a schematic diagram of a circuit path for an eFuse cell corresponding to at least one of the eFuse cells shown in FIG. 2, in accordance with some embodiments of the present disclosure. For illustration in FIG. 7, the program path for a eFuse cell including, for example, the eFuse cell 300A shown in FIG. 3A, the eFuse cell 400A shown in FIG. 4A or the eFuse cell 600A shown in FIG. 6A. The program path is illustrated as a physical layout in the left side of FIG. 7 and also as represented by an equivalent circuit path in the right side of FIG. 7. The program path as the physical layout corresponds to the program path as the equivalent circuit path with the same reference numbers for illustration.

For illustration in FIG. 7, the program path extends between a power supply VQPS to a ground. A resistor RVQPS is coupled between the power supply VQPS and a power switch P1 which, in some embodiments, is a PMOS switch, and the resistor RVQPS is associated with the connection of the power supply VQPS to the power switch transistor P1. A voltage VDDQ (which is also shown in FIG. 1) is provided at the drain of the PMOS power switch transistor P1.

The program path further extends to a program selection transistor P2 which, in some embodiments, is a PMOS, along the Y-direction. In some embodiments, the program selection transistor P2 corresponds to the read selection unit 120 in FIG. 1. The resistance of the program path between the program selection transistor P2 and the power switch P1 is identified as RVQ_YPASS, and is indicated as a resistor RVQ_YPASS as well.

The program path further extends from the program selection transistor P2 to the eFuse cell and the resistance between thereof is identified as Rdrop. The resistance of the eFuse cell is identified as Rfuse. Furthermore, the program path extends from the eFuse cell to a program transistor (e.g., at least one of the transistors T1-T4 shown in FIGS. 6A-6B), and the resistance between thereof is identified as Rdrain. The program path further extends through a selection transistor P3 which, in some embodiments, is a NMOS, to ground, and the resistance between thereof is identified as Rvss.

The table below compares parameters for a 5 nm generation when using a 1T1R layout structure for each of eFuse cells (which is indicated as 1T1R in the table) and when using the improved 1T2R layout structure for each of eFuse cells (which is indicated as 1T2R in the table), in accordance with some embodiments of the present disclosure, described above in connection with FIGS. 3A-6B.

| Parameter (ohms) | 1T1R | 1T2R |
|---|---|---|
| RVQ_YPASS | 41.95 | 30.83 |
| Rdrop | 62.06 | 42.31 |
| Total | 235.55 | 206.68 |

In some embodiments, the resistance RVQ_YPASS is reduced from about 41.95 ohm to about 30.83 ohm, and the resistance Rdrop is reduced from about 62.06 ohm to about 42.31 ohm, by the 1T2R layout structure. The overall resistance of the program path is reduced from about 235.55 ohm to about 206.68 ohm, by the 1T2R layout structure. Accordingly, during the program operation, the resistance of the eFuse cell is reduced about 15%~30%, and a current (not shown) is increased about 10%~20%.

Figure 8A:
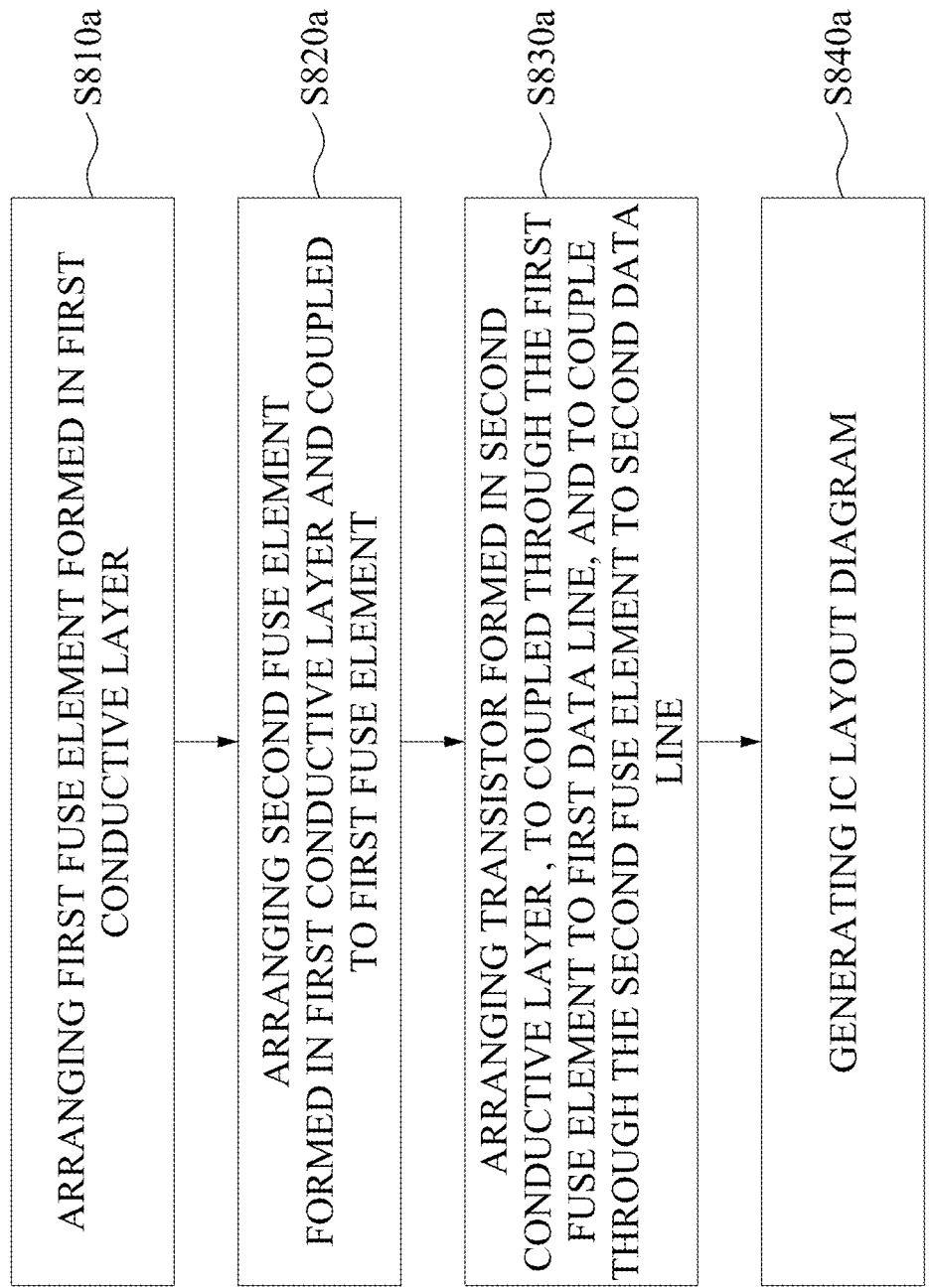
FIG. 8A is a flow chart of a method for generating an integrated circuit (IC) layout diagram including an eFuse cell, in accordance with some embodiments of the present disclosure.

FIG. 8A is a flow chart of a method 800A for generating an integrated circuit (IC) layout diagram including an eFuse cell including, for example, the layout structure 300B shown in FIG. 3B, the layout structure 400B shown in FIG. 4B, the layout structure 500A shown in FIG. 5A, or the layout structure 600B shown in FIG. 6B, in accordance with some embodiments of the present disclosure. For illustration in FIG. 8A, the method 800A includes operations S810a, S820a, S830a and S840a. Following illustrations of the method 800A in FIG. 8A with reference to the eFuse cell and the layout structure thereof in FIGS. 3A-6B include exemplary operations. However, the operations in FIG. 8A are not necessarily performed in the order shown. Alternatively stated, operations may be added, replaced, changed order, and/or eliminated as appropriate, in accordance with the spirit and scope of various embodiments of the present disclosure.

In operation S810a, a first fuse element formed in a first conductive layer is arranged. In some embodiments, the first fuse element corresponds to the eFuse element including, for example, the eFuse element 221 shown in FIG. 2, the eFuse element R1 shown in FIGS. 3A-6B. In some embodiments, the first conductive layer corresponds to the M2 layer discussed with reference to FIGS. 5A-5B.

In operation S820a, a second fuse element formed in the first conductive layer is arranged, and the second fuse element coupled to the first fuse element is arranged. In some embodiments, the second fuse element corresponds to the eFuse element including, for example, the eFuse element 222 shown in FIG. 2, the eFuse element R2 shown in FIGS. 3A-6B.

In some embodiments, at least one of the operations S810a or the operation S820a further includes other operations as the following. A fuse line formed in the first conductive layer is arranged. A pair of fuse segments disposed on opposite sides of the fuse line formed in the first conductive layer is arranged. A fuse conductive segment disposed between one of the pair of fuse segments and the other fuse element (e.g., the second fuse element if the first fuse element is arranged in such operation) is arranged, to couple one of the pair of fuse segments to the other fuse element (e.g., the second fuse element).

In some embodiments, the fuse line corresponds to the fuse line including, for example, the fuse line 51 shown in FIGS. 3B, 4B, 5A and 6B. In some embodiments, the pair of fuse segments corresponds to the fuse segments including, for example, the fuse segments 11 and 31 shown in FIGS. 3B, 4B, 5A and 6B. In some embodiments, the fuse conductive segment corresponds to the fuse conductive segment including, for example, the fuse conductive segment cf1 shown in FIGS. 3B, 4B, 5A and 6B.

In operation S830a, a transistor formed in a second conductive layer disposed below the first conductive layer is arranged, to couple through the first fuse element to a first data line for receiving a first data voltage, and to couple through the second fuse element to a second data line for receiving a second data voltage. In some embodiments, the transistor corresponds to the transistor including, for example, the transistor element 223 shown in FIG. 2, the transistor T1 shown in FIGS. 3A-6B. In some embodiments, the second conductive layer corresponds to the active area AA discussed with reference to FIGS. 5A-5B. In some embodiments, the first data line corresponds to the bit line BL0 shown in FIGS. 2-6B, and the second data line corresponds to the bit line BL1 shown in FIGS. 2-6B.

In operation S840a, the IC layout diagram including the first fuse element, the second fuse element, and the transistor is generated. In some embodiments, the IC layout diagram corresponds to the layout diagram including, for example, the layout structure 300B shown in FIG. 3B, the layout structure 400B shown in FIG. 4B, the layout structure 500A shown in FIG. 5A, and the layout structure 600B shown in FIG. 6B. In some embodiments, the integrated circuit including the eFuse cell, as discussed above, is fabricated based on the IC layout diagram generated in operation S840a.

Figure 8B:
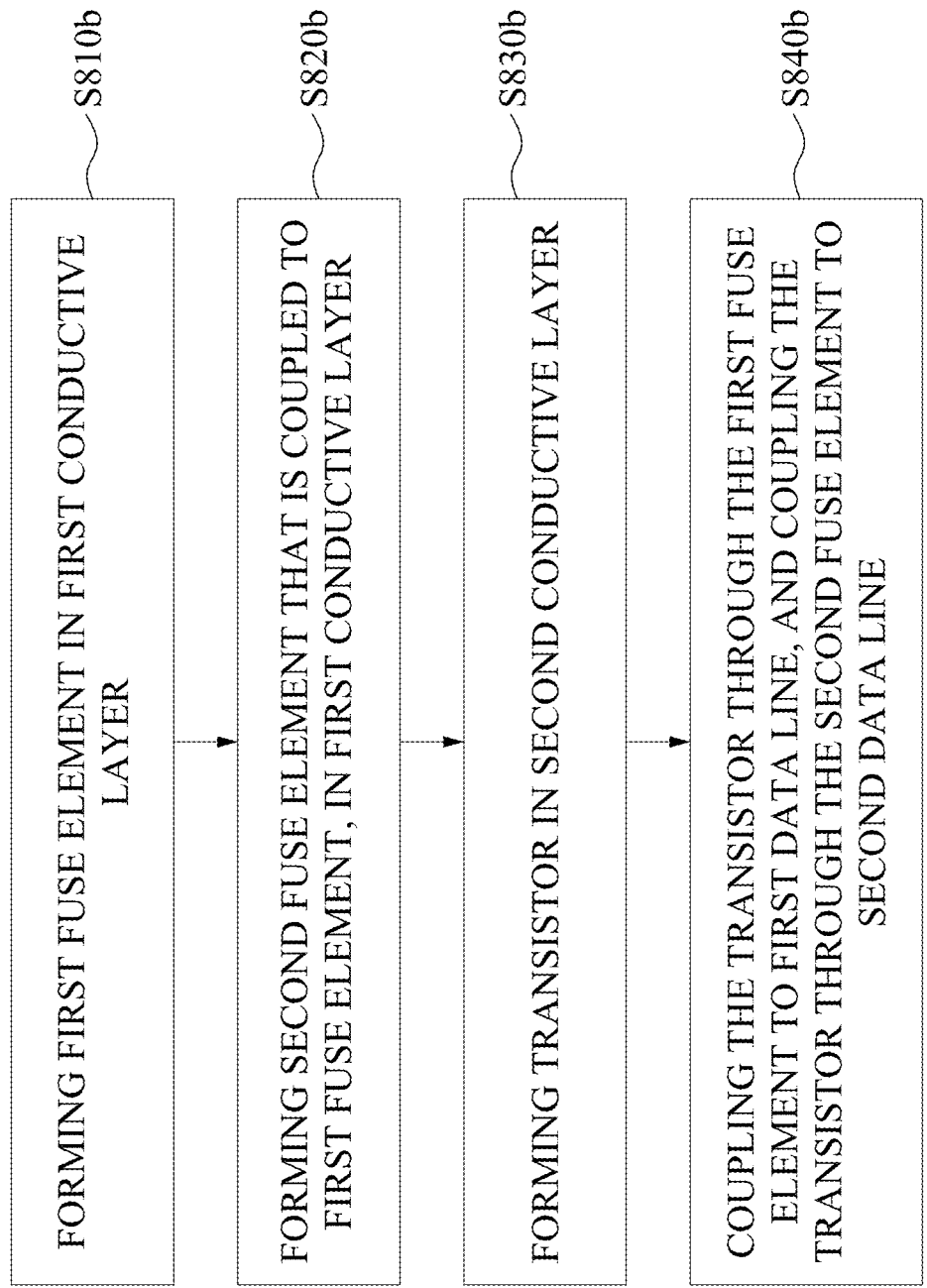
FIG. 8B is a flow chart of a method for generating an integrated circuit (IC) including an eFuse cell, in accordance with some embodiments of the present disclosure.

FIG. 8B is a flow chart of a method 800B for fabricating an integrated circuit (IC) including an eFuse cell including, for example, the eFuse cell 300A shown in FIG. 3A, the eFuse cell 400A shown in FIG. 4A or the eFuse cell 600A shown in FIG. 6A, in accordance with some embodiments of the present disclosure. For illustration in FIG. 8B, the method 800B includes operations S810b, S820b, S830b and S840b.

With reference to FIG. 8B, in operation S810b, a first fuse element is formed in a first conductive layer. In some embodiments, the first fuse element corresponds to the eFuse element including, for example, the eFuse element 221 shown in FIG. 2, or the eFuse element R1 shown in FIG. 3A, 4A, or 6A. In some embodiments, the first conductive layer corresponds to the M2 layer as discussed above with reference to FIGS. 5A-5B.

In operation S820b, a second fuse element that is coupled to the first fuse element is formed in the first conductive layer. In some embodiments, the second fuse element corresponds to the eFuse element including, for example, the eFuse element 222 shown in FIG. 2, or the eFuse element R2 shown in FIG. 3A, 4A or 6A.

In some embodiments, at least one of the operation S810b or the operation S820b includes operations as follows. A fuse line is formed in the first conductive layer. A pair of fuse segments that are disposed on opposite sides of the fuse line are formed in the first conductive layer. A fuse conductive segment that is disposed between one of the pair of fuse segments and the other fuse element (e.g., the second fuse element if the first fuse element is formed in such operation) is formed. The fuse conductive segment is coupled through one of the pair of fuse segments to the other fuse element (e.g., the second fuse element).

In operation S830b, a transistor is formed in a second conductive layer that is disposed below the first conductive layer. In some embodiments, the transistor corresponds to the transistor including, for example, the transistor element 223 shown in FIG. 2, the transistor T1 shown in FIG. 3A, 4A, or 6A. In some embodiments, the second conductive layer corresponds to the active area AA discussed with reference to FIGS. 5A-5B.

In operation S840b, the transistor is coupled through the first fuse element to a first data line for receiving a first data voltage, and the transistor is coupled through the second fuse element to a second data line for receiving a second data voltage. In some embodiments, the first data line corresponds to the bit line BL0 shown in FIG. 2, 3A, 4A, or 6A, and the second data line corresponds to the bit line BL1 shown in FIG. 2, 3A, 4A, or 6A.

Based on the above operations, the IC including the first fuse element, the second fuse element, and the transistor is generated. In some embodiments, the IC corresponds to a device including, for example, eFuse cell 300A shown in FIG. 3A, the eFuse cell 400A shown in FIG. 4A or the eFuse cell 600A shown in FIG. 6A.

Following illustrations of the method 800B in FIG. 8B with reference to the eFuse cell and the layout structure thereof in FIGS. 3A-6B include exemplary operations. However, the operations in FIG. 8B are not necessarily performed in the order shown. Alternatively stated, operations may be added, replaced, changed order, and/or eliminated as appropriate, in accordance with the spirit and scope of various embodiments of the present disclosure.

Figure 9:
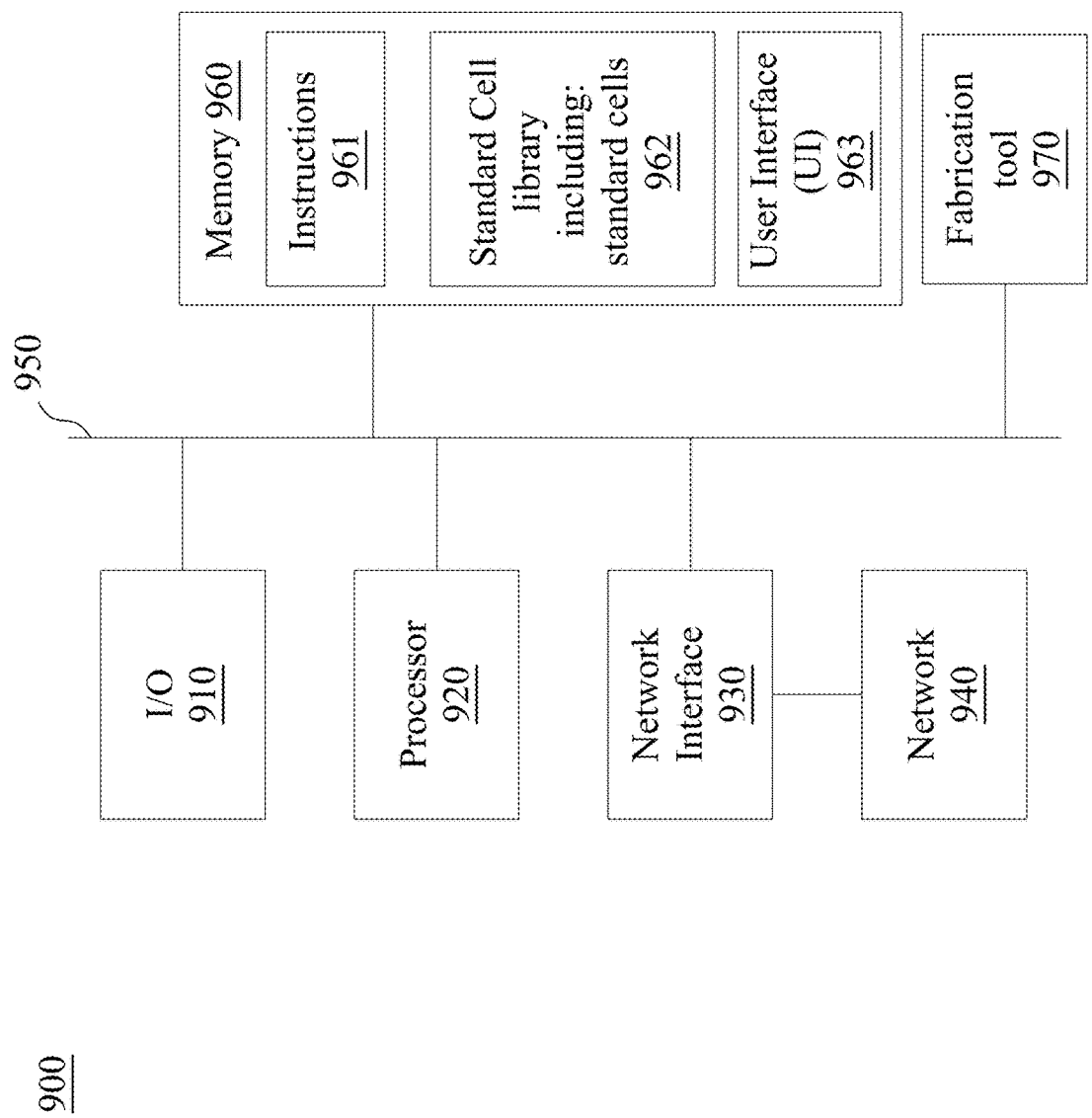
FIG. 9 is a block diagram of a system for designing an IC layout design, in accordance with some embodiments of the present disclosure.

Reference is now made to FIG. 9. FIG. 9 is a block diagram of electronic design automation (EDA) system 900 for designing the integrated circuit layout design, in accordance with some embodiments of the present disclosure. EDA system 900 is configured to implement one or more operations of the method 800A disclosed in FIG. 8A or the method 800B disclosed in FIG. 8B, and further explained in conjunction with FIGS. 3A-6B. In some embodiments, EDA system 900 includes an APR system.

In some embodiments, EDA system 900 is a general purpose computing device including a hardware processor 920 and a non-transitory, computer-readable storage medium 960. Storage medium 960, amongst other things, is encoded with, i.e., stores, computer program code (instructions) 961, i.e., a set of executable instructions. Execution of instructions 961 by hardware processor 920 represents (at least in part) an EDA tool which implements a portion or all of, e.g., the method 800A or 800B.

The processor 920 is electrically coupled to computer-readable storage medium 960 via a bus 950. The processor 920 is also electrically coupled to an I/O interface 910 and a fabrication tool 970 by bus 950. A network interface 930 is also electrically connected to processor 920 via bus 950. Network interface 930 is connected to a network 940, so that processor 920 and computer-readable storage medium 960 are capable of connecting to external elements via network 940. The processor 920 is configured to execute computer program code 961 encoded in computer-readable storage medium 960 in order to cause EDA system 900 to be usable for performing a portion or all of the noted processes and/or methods. In one or more embodiments, processor 920 is a central processing unit (CPU), a multi-processor, a distributed processing system, an application specific integrated circuit (ASIC), and/or a suitable processing unit.

In one or more embodiments, computer-readable storage medium 960 is an electronic, magnetic, optical, electromagnetic, infrared, and/or a semiconductor system (or apparatus or device). For example, computer-readable storage medium 960 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 960 includes a compact disk-read only memory (CD-ROM), a compact disk-read/write (CD-R/W), and/or a digital video disc (DVD).

In one or more embodiments, storage medium 960 stores computer program code 961 configured to cause EDA system 900 (where such execution represents (at least in part) the EDA tool) to be usable for performing a portion or all of the noted processes and/or methods. In one or more embodiments, storage medium 960 also stores information which facilitates performing a portion or all of the noted processes and/or methods. In one or more embodiments, storage medium 960 stores library 962 of standard cells including such standard cells as disclosed herein, for example, an eFuse cell including transistor T1 discussed above with respect to FIGS. 3A-3B, or an eFuse cell including transistors T1-T2 discussed above with respect to FIGS. 4A-5B, or an eFuse cell including transistors T1-T4 discussed above with respect to FIGS. 6A-6B.

EDA system 900 includes I/O interface 910. I/O interface 910 is coupled to external circuitry. In one or more embodiments, I/O interface 910 includes a keyboard, keypad, mouse, trackball, trackpad, touchscreen, and/or cursor direction keys for communicating information and commands to processor 920.

EDA system 900 also includes network interface 930 coupled to processor 920. Network interface 930 allows EDA system 900 to communicate with network 940, to which one or more other computer systems are connected. Network interface 930 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more EDA systems 900.

EDA system 900 also includes the fabrication tool 970 coupled to the processor 920. The fabrication tool 970 is configured to fabricate integrated circuits, including, for example, the memory circuit 100 illustrated in FIG. 1, based on the design files processed by the processor 920 and/or the IC layout designs as discussed above.

EDA system 900 is configured to receive information through I/O interface 910. The information received through I/O interface 910 includes one or more of instructions, data, design rules, libraries of standard cells, and/or other parameters for processing by processor 920. The information is transferred to processor 920 via bus 950. EDA system 900 is configured to receive information related to a UI through I/O interface 910. The information is stored in computer-readable medium 960 as user interface (UI) 963.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 900. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, for example, one or more of an optical disk, such as a DVD, a magnetic disk, such as a hard disk, a semiconductor memory, such as a ROM, a RAM, a memory card, and the like.

Figure 10:
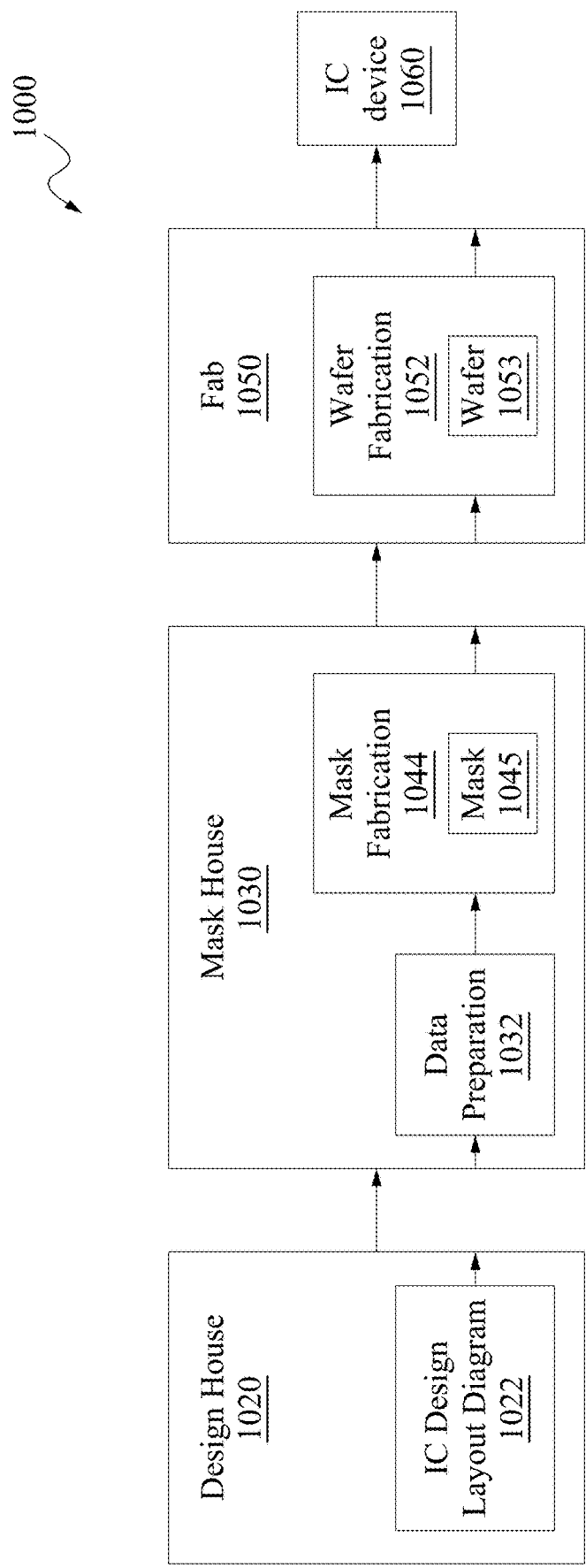
FIG. 10 is a block diagram of an IC manufacturing system, and an IC manufacturing flow associated therewith, in accordance with some embodiments.

FIG. 10 is a block diagram of IC manufacturing system 1000, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using IC manufacturing system 1000.

In FIG. 10, IC manufacturing system 1000 includes entities, such as a design house 1020, a mask house 1030, and an IC manufacturer/fabricator ("fab") 1050, that interact with one another in the design, development, and manufacturing cycles and/or services related to manufacturing an IC device 1060. The entities in IC manufacturing system 1000 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1020, mask house 1030, and IC fab 1050 is owned by a single larger company. In some embodiments, two or more of design house 1020, mask house 1030, and IC fab 1050 coexist in a common facility and use common resources.

Design house (or design team) 1020 generates an IC design layout diagram 1022. IC design layout diagram 1022 includes various geometrical patterns, for example, an layout structured depicted in FIG. 3B, FIG. 4B, FIG. 5A and/or FIG. 6A, designed for an IC device 1060, for example, memory circuit 100, eFuse cell 300A, 400A and 600A, discussed above with respect to FIG. 1, FIG. 3A, FIG. 4A and/or FIG. 6A. The geometrical patterns correspond to patterns of metal, oxide, or semiconductor layers that make up the various components of IC device 1060 to be fabricated. The various layers combine to form various IC features. For example, a portion of IC design layout diagram 1022 includes various IC features, such as an active region, gate electrode, source and drain, conductive segments or vias of an interlayer interconnection, to be formed in a semiconductor substrate (such as a silicon wafer) and various material layers disposed on the semiconductor substrate. Design house 1020 implements a proper design procedure to form IC design layout diagram 1022. The design procedure includes one or more of logic design, physical design or place and route. IC design layout diagram 1022 is presented in one or more data files having information of the geometrical patterns. For example, IC design layout diagram 1022 can be expressed in a GDSII file format or DFII file format.

Mask house 1030 includes mask data preparation 1032 and mask fabrication 1044. Mask house 1030 uses IC design layout diagram 1022 to manufacture one or more masks 1045 to be used for fabricating the various layers of IC device 1060 according to IC design layout diagram 1022. Mask house 1030 performs mask data preparation 1032, where IC design layout diagram 1022 is translated into a representative data file ("RDF"). Mask data preparation 1032 provides the RDF to mask fabrication 1044. Mask fabrication 1044 includes a mask writer. A mask writer converts the RDF to an image on a substrate, such as a mask (reticle) 1045 or a semiconductor wafer 1053. The IC design layout diagram 1022 is manipulated by mask data preparation 1032 to comply with particular characteristics of the mask writer and/or requirements of IC fab 1050. In FIG. 10, data preparation 1032 and mask fabrication 1044 are illustrated as separate elements. In some embodiments, data preparation 1032 and mask fabrication 1044 can be collectively referred to as mask data preparation.

In some embodiments, data preparation 1032 includes optical proximity correction (OPC) which uses lithography enhancement techniques to compensate for image errors, such as those that can arise from diffraction, interference, other process effects and the like. OPC adjusts IC design layout diagram 1022. In some embodiments, data preparation 1032 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, data preparation 1032 includes a mask rule checker (MRC) that checks the IC design layout diagram 1022 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1022 to compensate for limitations during mask fabrication 1044, which may undo part of the modifications performed by OPC in order to meet mask creation rules.

In some embodiments, data preparation 1032 includes lithography process checking (LPC) that simulates processing that will be implemented by IC fab 1050 to fabricate IC device 1060. LPC simulates this processing based on IC design layout diagram 1022 to create a simulated manufactured device, such as IC device 1060. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 1022.

It should be understood that the above description of data preparation 1032 has been simplified for the purposes of clarity. In some embodiments, data preparation 1032 includes additional features such as a logic operation (LOP) to modify the IC design layout diagram 1022 according to manufacturing rules. Additionally, the processes applied to IC design layout diagram 1022 during data preparation 1032 may be executed in a variety of different orders.

After data preparation 1032 and during mask fabrication 1044, a mask 1045 or a group of masks 1045 are fabricated based on the modified IC design layout diagram 1022. In some embodiments, mask fabrication 1044 includes performing one or more lithographic exposures based on IC design layout diagram 1022. In some embodiments, an electron-beam (e-beam) or a mechanism of multiple e-beams is used to form a pattern on a mask (photomask or reticle) 1045 based on the modified IC design layout diagram 1022. Mask 1045 can be formed in various technologies. In some embodiments, mask 1045 is formed using binary technology. In some embodiments, a mask pattern includes opaque regions and transparent regions. A radiation beam, such as an ultraviolet (UV) beam, used to expose the image sensitive material layer (for example, photoresist) which has been coated on a wafer, is blocked by the opaque region and transmits through the transparent regions. In one example, a binary mask version of mask 1045 includes a transparent substrate (for example, fused quartz) and an opaque material (for example, chromium) coated in the opaque regions of the binary mask. In another example, mask 1045 is formed using a phase shift technology. In a phase shift mask (PSM) version of mask 1045, various features in the pattern formed on the phase shift mask are configured to have proper phase difference to enhance the resolution and imaging quality. In various examples, the phase shift mask can be attenuated PSM or alternating PSM. The mask(s) generated by mask fabrication 1044 is used in a variety of processes. For example, such a mask(s) is used in an ion implantation process to form various doped regions in semiconductor wafer 1053, in an etching process to form various etching regions in semiconductor wafer 1053, and/or in other suitable processes.

IC fab 1050 includes wafer fabrication 1052. IC fab 1050 is an IC fabrication business that includes one or more manufacturing facilities for the fabrication of a variety of different IC products. In some embodiments, IC Fab 1050 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 1050 uses mask(s) 1045 fabricated by mask house 1030 to fabricate IC device 1060. Thus, IC fab 1050 at least indirectly uses IC design layout diagram 1022 to fabricate IC device 1060. In some embodiments, semiconductor wafer 1053 is fabricated by IC fab 1050 using mask(s) 1045 to form IC device 1060. In some embodiments, the IC fabrication includes performing one or more lithographic exposures based at least indirectly on IC design layout diagram 1022. Semiconductor wafer 1053 includes a silicon substrate or other proper substrate having material layers formed thereon. Semiconductor wafer 1053 further includes one or more of various doped regions, dielectric features, multilevel interconnects, and the like (formed at subsequent manufacturing steps).

Moreover, various circuits or devices to implement the transistors in the aforementioned embodiments are within the contemplated scope of the present disclosure.

Furthermore, in some embodiments of this document, at least one of the transistors is implemented with at least one metal oxide semiconductor (MOS) transistor, at least one bipolar junction transistor (BJT), etc., or the combination thereof. Various circuits or devices to implement the transistors in the aforementioned embodiments are within the contemplated scope of the present disclosure.

In some embodiments, an integrated circuit is disclosed. The integrated circuit includes a transistor, a first fuse element and a second fuse element. The transistor is formed in a first conductive layer. The first fuse element is formed in a second conductive layer disposed above the first conductive layer. The second fuse element is formed in the second conductive layer and is coupled to the first fuse element. The transistor is coupled through the first fuse element to a first data line for receiving a first data signal, and the transistor is coupled through the second fuse element to a second data line for receiving a second data signal.

In some embodiments, the integrated circuit further includes a fuse conductive segment. The fuse conductive segment is formed in the second conductive layer. The fuse conductive segment abuts between the first fuse element and the second fuse element, and couples the first fuse element to the second fuse element.

In some embodiments, the integrated circuit further includes a conductive segment. The conductive segment is formed in a third conductive layer disposed between the first conductive layer and the second conductive layer. The conductive segment, part of the first fuse element and part of the transistor are overlapped in a layout view, and the first fuse element is coupled through the conductive segment to the transistor.

In some embodiments, the first fuse element includes a fuse line and a pair of fuse segments. The pair of fuse segments are disposed on opposite sides of the fuse line. One of the pair of fuse segments is coupled through a fuse conductive segment formed in the second conductive layer to the second fuse element.

In some embodiments, the first fuse element includes a first fuse line and a pair of first fuse segments. The pair of first fuse segments is disposed on opposite sides of an end of the first fuse line. The second fuse element includes a second fuse line and a pair of second fuse segments. The pair of second fuse segments disposed on opposite sides of an end of the second fuse line. One of the pair of the first fuse segments is coupled through a fuse conductive segment formed in the second conductive layer to one of the pair of second fuse segments.

In some embodiments, one of the pair of the first fuse segments, which is coupled to one of the pair of second fuse segments, is further coupled to the transistor through a conductive segment formed in a third conductive layer disposed between the first conductive layer and the second conductive layer.

In some embodiments, an integrated circuit is disclosed. The integrated circuit includes an electrical fuse cell array. The electrical fuse cell array includes a plurality of electrical fuse cells that are arranged in rows and columns. The plurality of electrical fuse cells include a first conductive segment, a first transistor and a pair of first fuse elements. The first transistor is formed in a first conductive layer. The pair of first fuse elements are formed in a second conductive layer disposed above the first conductive layer. The pair of first fuse elements are coupled together and are coupled through the first conductive segment to the first transistor. The first transistor is coupled through one of the pair of first fuse elements to a first data line for receiving a first data signal, and the first transistor is coupled through the other one of the pair of first fuse elements to a second data line for receiving a second data signal.

In some embodiments, the plurality of electrical fuse cells further include a second transistor, a first program line and a second program line. The second transistor is formed in the first conductive layer and disposed next to the first transistor. The first program line is formed in a third conductive layer disposed between the first conductive layer and the second conductive layer. The first transistor is coupled to the first program line. The second program line is formed in the third conductive layer and disposed next to the first program line. The second transistor is coupled to the second program line. Both of the first program line and the second program line are disposed above or below all of the first transistor, the second transistor and the pair of first fuse elements in a layout view.

In some embodiments, the integrated circuit further includes a third conductive layer. The third conductive layer is disposed between the first conductive layer and the second conductive layer. The first conductive segment is formed in the third conductive layer and is partially overlapped with first transistor and one of the pair of first fuse elements in a layout view.

In some embodiments, one of the pair of first fuse elements includes a fuse line, a first pair of fuse segments and a second pair of fuse segments. The first pair of fuse segments are disposed on opposite sides of a first end of the fuse line. The second pair of fuse segments are disposed on opposite sides of a second end of the fuse line. The first end and the second end are opposite from each other. One of the first pair of fuse segments is overlapped with the first conductive segment in a layout view. The second pair of fuse segments and part of the fuse line are overlapped with the first data line in a layout view.

In some embodiments, one of the pair of first fuse elements includes a first fuse line and a pair of first fuse segments. The pair of first fuse segments are disposed on opposite sides of an end of the first fuse line. The other one of the pair of first fuse elements includes a second fuse line and a pair of second fuse segments. The pair of second fuse segments disposed on opposite sides of an end of the second fuse line. One of the pair of first fuse segments is coupled through a fuse conductive segment formed in the second conductive layer to one of the pair of second fuse segments, and is overlapped with the first conductive segment in a layout view.

In some embodiments, the integrated circuit further includes a first program line and a second program line. The first program line is formed in a third conductive layer disposed between the first conductive layer and the second conductive layer. The first transistor is coupled to the first program line. The second program line is formed in the third conductive layer and is disposed next to the first program line. Both of the first program line and the second program line are disposed above or below the plurality of electrical fuse cells in a layout view. the plurality of electrical fuse cells further include a second transistor and a pair of second fuse elements. The second transistor is formed in the first conductive layer and is disposed next to the first transistor. The second transistor is coupled to the second program line. The pair of second fuse elements are formed in the second conductive layer and are coupled together by a fuse conductive segment. The pair of first fuse elements are disposed between the pair of second fuse elements and the second transistor in a layout view. The second transistor is coupled through one of the pair of second fuse elements to the first data line for receiving the first data signal, and the second transistor is coupled through the other one of the pair of second fuse elements to the second data line for receiving the second data signal.

In some embodiments, the plurality of electrical fuse cells further include a second conductive segment. The second conductive segment is disposed next to the first conductive segment. The pair of second fuse elements are coupled through the second conductive segment to the second transistor. The first conductive segment and the second conductive segment are formed in a fourth conductive layer disposed between the second conductive layer and the third conductive layer. The second conductive segment and the first conductive segment have different length.

In some embodiments, the integrated circuit further includes a third program line and a fourth program line. The third program line is formed in the third conductive layer and is disposed apart from both of the first program line and the second program line. The fourth program line is formed in the third conductive layer and is disposed next to the third program line. Both of the third program line and the fourth program line are disposed above or below the plurality of electrical fuse cells in a layout view. The plurality of electrical fuse cells further include a third transistor, a fourth transistor, a pair of third fuse elements and a pair of fourth fuse elements. The third transistor is formed in the first conductive layer. The third transistor is coupled to the third program line. The fourth transistor is formed in the first conductive layer and is disposed next to the third transistor. The fourth transistor is coupled to the fourth program line. The pair of third fuse elements are formed in the second conductive layer and are coupled together. The pair of second fuse elements are disposed between the pair of first fuse elements and the pair of third fuse elements. The pair of fourth fuse elements are formed in the second conductive layer and are coupled together. The pair of third fuse elements are disposed between the pair of second fuse elements and the pair of fourth fuse elements. The third transistor is coupled through one of the pair of third fuse elements to the first data line for receiving the first data signal, and the second transistor is coupled through the other one of the pair of second fuse elements to the second data line for receiving the second data signal.

In some embodiments, a method of fabricating an integrated circuit (IC) is disclosed. The method includes the following operations: forming a first fuse element in a first conductive layer, in the integrated circuit; forming a second fuse element that is coupled to the first fuse element, in the first conductive layer, in the integrated circuit; forming a transistor in a second conductive layer disposed below the first conductive layer, in the integrated circuit; and coupling the transistor through the first fuse element to a first data line for receiving a first data voltage, and coupling the transistor through the second fuse element to a second data line for receiving a second data voltage.

In some embodiments, the method further includes the following operations: forming a fuse conductive segment in the first conductive layer; and coupling the first fuse element through the fuse conductive segment to the second fuse element.

In some embodiments, the method further includes the following operations: forming a conductive segment in a third conductive layer disposed between the first conductive layer and the second conductive layer; and coupling the first fuse element through the conductive segment to the transistor.

In some embodiments, the method further includes the following operations: forming a fuse conductive segment that is abutted between the first fuse element and the second fuse element, in the second conductive layer; forming a conductive segment in a third conductive layer disposed between the first conductive layer and the second conductive layer; and coupling the first fuse element through the conductive segment to the transistor.

In some embodiments, the operation of forming the first fuse element further includes the following operations: forming a fuse line; forming a pair of fuse segments disposed on opposite sides of the fuse line; forming a fuse conductive segment disposed between the second fuse element and one of the pair of fuse segments; and coupling the fuse conductive segment through one of the pair of fuse segments to the second fuse element.

In some embodiments, the method further includes the following operations: forming a conductive segment that is coupled between the first fuse element and the transistor, in a third conductive layer disposed between the first conductive layer and the second conductive layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating an integrated circuit (IC), comprising:
   forming a first fuse element in a first conductive layer, in the integrated circuit;
   forming a second fuse element that is coupled to the first fuse element, in the first conductive layer, in the integrated circuit;
   forming a transistor in a second conductive layer disposed below the first conductive layer, in the integrated circuit; and
   coupling the transistor through the first fuse element to a first data line for receiving a first data voltage, and coupling the transistor through the second fuse element to a second data line for receiving a second data voltage,
   wherein the first fuse element and the second fuse element are disposed above the transistor.

2. The method of claim 1, further comprises:
   forming a fuse conductive segment that is abutted between the first fuse element and the second fuse element, in the second conductive layer;
   forming a conductive segment in a third conductive layer disposed between the first conductive layer and the second conductive layer; and
   coupling the first fuse element through the conductive segment to the transistor.

3. The method of claim 1, further comprises:
   forming a conductive segment in a third conductive layer disposed between the first conductive layer and the second conductive layer; and
   coupling the first fuse element through the conductive segment to the transistor.

4. The method of claim 1, further comprises:
   forming a fuse conductive segment in the first conductive layer; and
   coupling the first fuse element through the fuse conductive segment to the second fuse element.

5. The method of claim 1, wherein forming the first fuse element comprises:
   forming a fuse line;
   forming a pair of fuse segments disposed on opposite sides of the fuse line;
   forming a fuse conductive segment disposed between the second fuse element and one of the pair of fuse segments; and
   coupling the fuse conductive segment through one of the pair of fuse segments to the second fuse element.

6. The method of claim 5, further comprises:
   forming a conductive segment that is coupled between the first fuse element and the transistor, in a third conductive layer disposed between the first conductive layer and the second conductive layer.

7. An integrated circuit, comprising:
   a transistor formed in a first conductive layer;
   a first fuse element formed in a second conductive layer disposed above the first conductive layer; and
   a second fuse element formed in the second conductive layer and coupled to the first fuse element,
   wherein the transistor is coupled through the first fuse element to a first data line for receiving a first data signal, and the transistor is coupled through the second fuse element to a second data line for receiving a second data signal,
   wherein the first fuse element and the second fuse element are disposed above the transistor.

8. The integrated circuit of claim 7, further comprising:
   a conductive segment formed in a third conductive layer disposed between the first conductive layer and the second conductive layer,
   wherein the conductive segment, part of the first fuse element and part of the transistor are overlapped in a layout view, and the first fuse element is coupled through the conductive segment to the transistor.

9. The integrated circuit of claim 7, wherein the first fuse element comprises:
a fuse line; and
a pair of fuse segments disposed on opposite sides of the fuse line,
wherein one of the pair of fuse segments is coupled through a fuse conductive segment formed in the second conductive layer to the second fuse element.

10. The integrated circuit of claim 7, further comprising:
a fuse conductive segment formed in the second conductive layer,
wherein the fuse conductive segment abuts between the first fuse element and the second fuse element, and couples the first fuse element to the second fuse element.

11. The integrated circuit of claim 7, wherein the first fuse element comprises:
a first fuse line; and
a pair of first fuse segments disposed on opposite sides of an end of the first fuse line,
wherein the second fuse element comprises:
a second fuse line; and
a pair of second fuse segments disposed on opposite sides of an end of the second fuse line,
wherein one of the pair of first fuse segments is coupled through a fuse conductive segment formed in the second conductive layer to one of the pair of second fuse segments.

12. The integrated circuit of claim 11, wherein
one of the pair of first fuse segments, which is coupled to one of the pair of second fuse segments, is further coupled to the transistor through a conductive segment formed in a third conductive layer disposed between the first conductive layer and the second conductive layer.

13. An integrated circuit, comprising:
an electrical fuse cell array comprising a plurality of electrical fuse cells that are arranged in rows and columns, wherein the plurality of electrical fuse cells comprise:
a first conductive segment;
a first transistor formed in a first conductive layer; and
a pair of first fuse elements formed in a second conductive layer disposed above the first conductive layer, wherein the pair of first fuse elements are disposed above the first transistor,
wherein the pair of first fuse elements are coupled together and are coupled through the first conductive segment to the first transistor, and
the first transistor is coupled through one of the pair of first fuse elements to a first data line for receiving a first data signal, and the first transistor is coupled through the other one of the pair of first fuse elements to a second data line for receiving a second data signal.

14. The integrated circuit of claim 13, wherein the plurality of electrical fuse cells further comprise:
a second transistor formed in the first conductive layer and disposed next to the first transistor;
a first program line formed in a third conductive layer disposed between the first conductive layer and the second conductive layer, wherein the first transistor is coupled to the first program line; and
a second program line formed in the third conductive layer and disposed next to the first program line, wherein the second transistor is coupled to the second program line,
wherein both of the first program line and the second program line are disposed above or below all of the first transistor, the second transistor and the pair of first fuse elements in a layout view.

15. The integrated circuit of claim 13, wherein one of the pair of first fuse elements comprises:
a first fuse line; and
a pair of first fuse segments disposed on opposite sides of an end of the first fuse line,
wherein the other one of the pair of first fuse elements comprises:
a second fuse line; and
a pair of second fuse segments disposed on opposite sides of an end of the second fuse line,
wherein one of the pair of first fuse segments is coupled through a fuse conductive segment formed in the second conductive layer to one of the pair of second fuse segments, and is overlapped with the first conductive segment in a layout view.

16. The integrated circuit of claim 13, wherein one of the pair of first fuse elements comprises:
a fuse line;
a first pair of fuse segments disposed on opposite sides of a first end of the fuse line; and
a second pair of fuse segments disposed on opposite sides of a second end of the fuse line, wherein the first end and the second end are opposite from each other,
wherein one of the first pair of fuse segments is overlapped with the first conductive segment in a layout view, and
the second pair of fuse segments and part of the fuse line are overlapped with the first data line in a layout view.

17. The integrated circuit of claim 13, further comprising:
a third conductive layer disposed between the first conductive layer and the second conductive layer,
wherein the first conductive segment is formed in the third conductive layer and is partially overlapped with first transistor and one of the pair of first fuse elements in a layout view.

18. The integrated circuit of claim 13, further comprising:
a first program line formed in a third conductive layer disposed between the first conductive layer and the second conductive layer, wherein the first transistor is coupled to the first program line; and
a second program line formed in the third conductive layer and disposed next to the first program line, wherein both of the first program line and the second program line are disposed above or below the plurality of electrical fuse cells in a layout view,
wherein the plurality of electrical fuse cells further comprise:
a second transistor formed in the first conductive layer and disposed next to the first transistor, wherein the second transistor is coupled to the second program line; and
a pair of second fuse elements formed in the second conductive layer and coupled together by a fuse conductive segment, wherein the pair of first fuse elements are disposed between the pair of second fuse elements and the second transistor in a layout view,
wherein the second transistor is coupled through one of the pair of second fuse elements to the first data line for receiving the first data signal, and the second transistor is coupled through the other one of the pair of second fuse elements to the second data line for receiving the second data signal.

19. The integrated circuit of claim 18, further comprising:
a third program line formed in the third conductive layer and disposed apart from both of the first program line and the second program line; and
a fourth program line formed in the third conductive layer and disposed next to the third program line, wherein both of the third program line and the fourth program line are disposed above or below the plurality of electrical fuse cells in a layout view,
wherein the plurality of electrical fuse cells further comprise:
a third transistor formed in the first conductive layer, wherein the third transistor is coupled to the third program line;
a fourth transistor formed in the first conductive layer and disposed next to the third transistor, wherein the fourth transistor is coupled to the fourth program line;
a pair of third fuse elements formed in the second conductive layer and coupled together, wherein the pair of second fuse elements are disposed between the pair of first fuse elements and the pair of third fuse elements; and
a pair of fourth fuse elements formed in the second conductive layer and coupled together, wherein the pair of third fuse elements are disposed between the pair of second fuse elements and the pair of fourth fuse elements,
wherein the third transistor is coupled through one of the pair of third fuse elements to the first data line for receiving the first data signal, and the second transistor is coupled through the other one of the pair of second fuse elements to the second data line for receiving the second data signal.

20. The integrated circuit of claim 18, wherein the plurality of electrical fuse cells further comprise:
a second conductive segment disposed next to the first conductive segment,
wherein the pair of second fuse elements are coupled through the second conductive segment to the second transistor,
the first conductive segment and the second conductive segment are formed in a fourth conductive layer disposed between the second conductive layer and the third conductive layer, and
the second conductive segment and the first conductive segment have different length.

* * * * *